US012562221B2

(12) United States Patent
Sanuki et al.

(10) Patent No.: US 12,562,221 B2
(45) Date of Patent: Feb. 24, 2026

(54) MEMORY DEVICE CONFIGURED TO PERFORM A SEARCH OPERATION

(71) Applicant: Kioxia Corporation, Tokyo (JP)

(72) Inventors: Tomoya Sanuki, Yokkaichi Mie (JP);
Yasuhito Yoshimizu, Kawasaki
Kanagawa (JP)

(73) Assignee: Kioxia Corporation, Tokyo (JP)

( * ) Notice: Subject to any disclaimer, the term of this
patent is extended or adjusted under 35
U.S.C. 154(b) by 79 days.

(21) Appl. No.: 18/587,935

(22) Filed: Feb. 26, 2024

(65) Prior Publication Data

US 2024/0304239 A1     Sep. 12, 2024

(30) Foreign Application Priority Data

Mar. 7, 2023     (JP) ................................. 2023-034347

(51) Int. Cl.
*G11C 11/56*          (2006.01)
*G11C 11/4074*        (2006.01)
*G11C 11/408*         (2006.01)
*G11C 11/4096*        (2006.01)

(52) U.S. Cl.
CPC ...... *G11C 11/4096* (2013.01); *G11C 11/4074*
(2013.01); *G11C 11/4085* (2013.01)

(58) Field of Classification Search
CPC ............ G11C 11/4096; G11C 11/4074; G11C
11/4085; G11C 11/5642; G11C 16/08;
G11C 16/26; G11C 16/0483
USPC .................................................. 365/189.011
See application file for complete search history.

(56) References Cited

U.S. PATENT DOCUMENTS

| | | | |
|---|---|---|---|
| 5,388,065 A | 2/1995 | Yoneda | |
| 8,780,634 B2 | 7/2014 | Li | |
| 10,643,701 B2 | 5/2020 | Ma et al. | |
| 10,930,348 B1 | 2/2021 | Li et al. | |
| 12,057,179 B2 * | 8/2024 | Tseng ................... G11C 7/1006 | |
| 2014/0133233 A1 | 5/2014 | Li | |
| 2019/0221262 A1 | 7/2019 | Ma et al. | |
| 2021/0036168 A1 | 2/2021 | Lu et al. | |
| 2021/0050060 A1 | 2/2021 | Li et al. | |

(Continued)

FOREIGN PATENT DOCUMENTS

| | | |
|---|---|---|
| JP | H05-144276 A | 6/1993 |
| JP | 2965099 B2 | 10/1999 |
| JP | 2013065374 A | 4/2013 |

(Continued)

OTHER PUBLICATIONS

U.S. Appl. No. 18/177,115 filed Mar. 2, 2023.

*Primary Examiner* — Huan Hoang
(74) *Attorney, Agent, or Firm* — Kim & Stewart LLP

(57) ABSTRACT

A memory device includes a bit line, a source line, a first
string in which a plurality of first memory cells are con-
nected in series between the bit line and the source line, and
a control circuit. The control circuit performs a sense
operation for a search operation to determine if search data
is stored in the plurality of first memory cells by supplying
voltages to a plurality of word lines respectively correspond-
ing to the plurality of first memory cells based on the search
data and determining a similarity between the search data
and data actually stored in the plurality of first memory cells
based on a change in voltage of the bit line caused by current
flowing between the bit line and the source line via the first
string.

20 Claims, 19 Drawing Sheets

(56) References Cited

U.S. PATENT DOCUMENTS

| 2022/0172781 A1 | 6/2022 | Tran et al. |
| 2022/0309328 A1 | 9/2022 | Saxena et al. |

FOREIGN PATENT DOCUMENTS

| JP | 6888787 B2 | 6/2021 |
| WO | 2017195874 A1 | 11/2017 |

* cited by examiner

Figure 5:
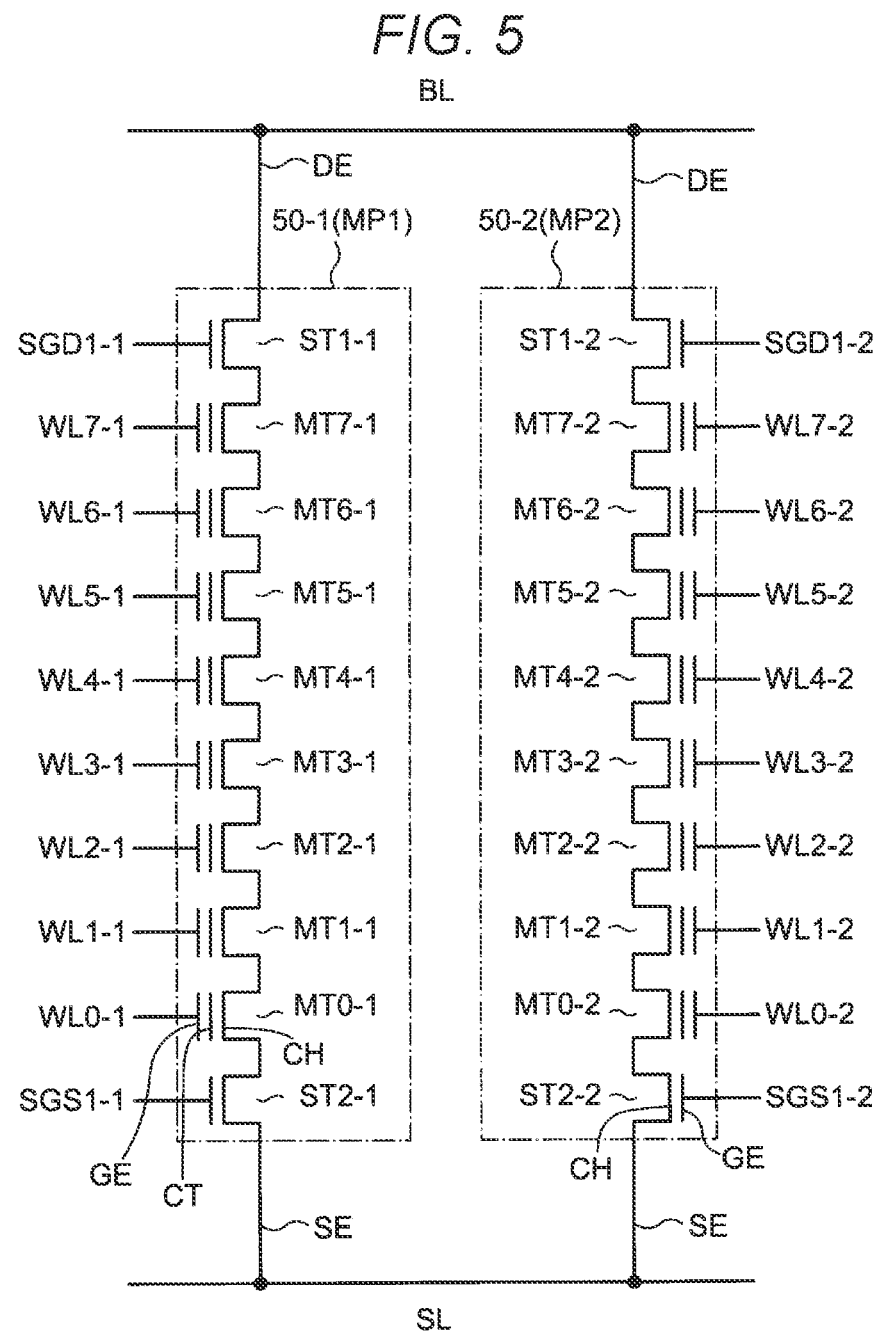

SGD1-1 —┤├— ST1-1        ST1-2 —┤├— SGD1-2

WL7-1 —┤├— MT7-1        MT7-2 —┤├— WL7-2

WL6-1 —┤├— MT6-1        MT6-2 —┤├— WL6-2

WL5-1 —┤├— MT5-1        MT5-2 —┤├— WL5-2

WL4-1 —┤├— MT4-1        MT4-2 —┤├— WL4-2

WL3-1 —┤├— MT3-1        MT3-2 —┤├— WL3-2

WL2-1 —┤├— MT2-1        MT2-2 —┤├— WL2-2

WL1-1 —┤├— MT1-1        MT1-2 —┤├— WL1-2

WL0-1 —┤├— MT0-1        MT0-2 —┤├— WL0-2

CH

SGS1-1 —┤├— ST2-1        ST2-2 —┤├— SGS1-2

|  | WL bias | MT_Vth | On/Off |
|---|---|---|---|
| WL2n | 0V | Any | On |
| ⋮ | ⋮ | ⋮ | ⋮ |
| WL2k+2 | 0V | Any | On |
| WL2k+1 | (Fig. 10, 11) | | |
| WL2k | | | |
| WL2k-1 | 0V | Any | On |
| ⋮ | ⋮ | ⋮ | ⋮ |
| WL0 | 0V | Any | On |

FIG. 10

| Stored Data | Vth | |
|---|---|---|
|  | WL2k | WL2k+1 |
| 0 | Er | A |
| 1 | A | Er |

FIG. 11

| Search Data | WL bias | |
|---|---|---|
|  | WL2k | WL2k+1 |
| 0 | 0V | H |
| 1 | H | 0V |
| X | H | H |

FIG. 12

| Stored Data | Search Data | BL-SL Current (On/Off) |
|---|---|---|
| 0 | 0 | Off |
| 0 | 1 | On |
| 0 | X | Off |
| 1 | 0 | On |
| 1 | 1 | Off |
| 1 | X | Off |

50

*FIG. 15*
| Search Data | WL bias | |
|:---:|:---:|:---:|
| | WL2k | WL2k+1 |
| 0 | H | 0V |
| 1 | 0V | H |
| X | H | H |
*FIG. 16*
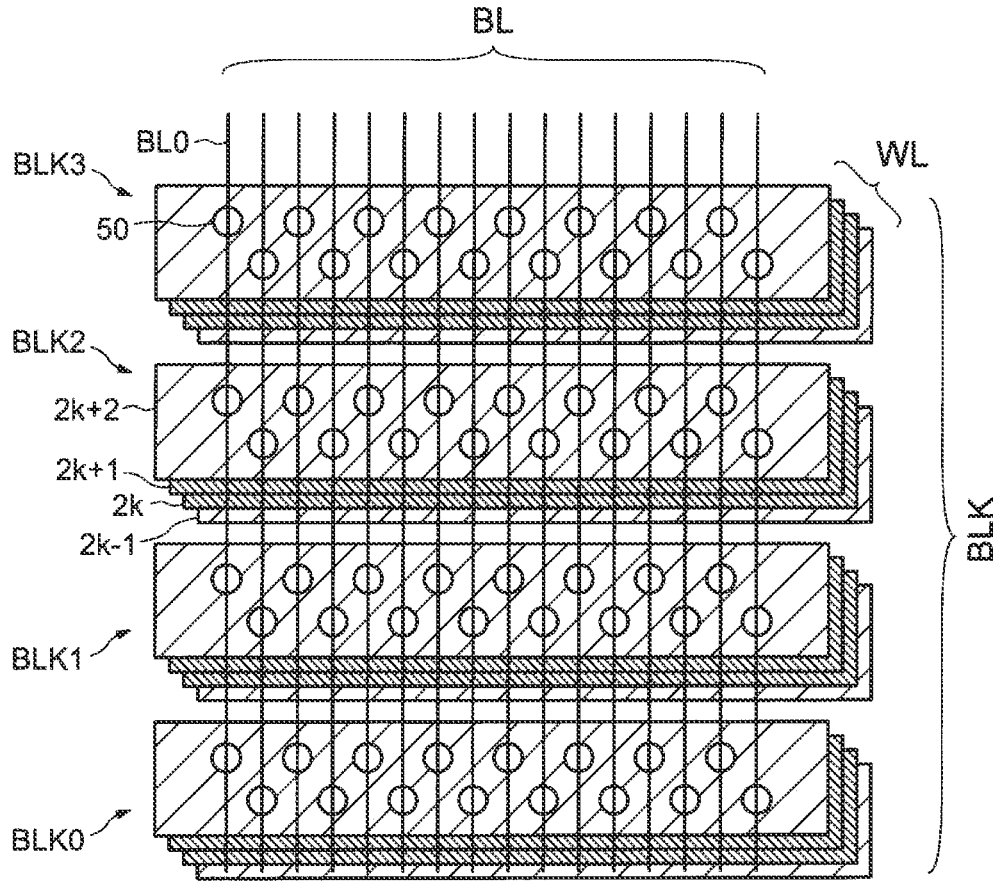
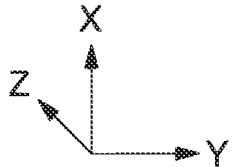

| BLK | BL0 | BL1 | BL2 | BL3 |
|-----|-----|-----|-----|-----|
| 0 | 0 | 0 | 1 | 0 |
| 1 | 0 | 0 | 1 | 1 |
| 2 | 1 | 0 | 1 | 0 |
| 3 | 0 | 1 | 0 | 0 |
| 4 | 0 | 0 | 0 | 0 |
| 5 | 1 | 1 | 1 | 0 |
| 6 | 1 | 0 | 0 | 1 |
| 7 | 0 | 1 | 1 | 0 |

| Query | BLK | BL0 | BL1 | BL2 | BL3 |
|-------|-----|-----|-----|-----|-----|
| 0 | 0 | Off | Off | On | Off |
| 0 | 1 | Off | Off | On | On |
| 0 | 2 | On | Off | On | Off |
| 1 | 3 | On | Off | On | On |
| 0 | 4 | Off | Off | Off | Off |
| 1 | 5 | Off | Off | Off | On |
| 0 | 6 | On | Off | Off | On |
| 1 | 7 | On | Off | Off | On |

50

50

MEMORY DEVICE CONFIGURED TO PERFORM A SEARCH OPERATION

CROSS-REFERENCE TO RELATED APPLICATION(S)

This application is based upon and claims the benefit of priority from Japanese Patent Application No. 2023-034347, filed Mar. 7, 2023, the entire contents of which are incorporated herein by reference.

FIELD

Embodiments described herein relate generally to a memory device configured to perform a search operation.

BACKGROUND

Memory systems including NAND flash memories serving as semiconductor memory devices and controllers controlling the NAND flash memories are known.

DESCRIPTION OF THE DRAWINGS

Figure 1:
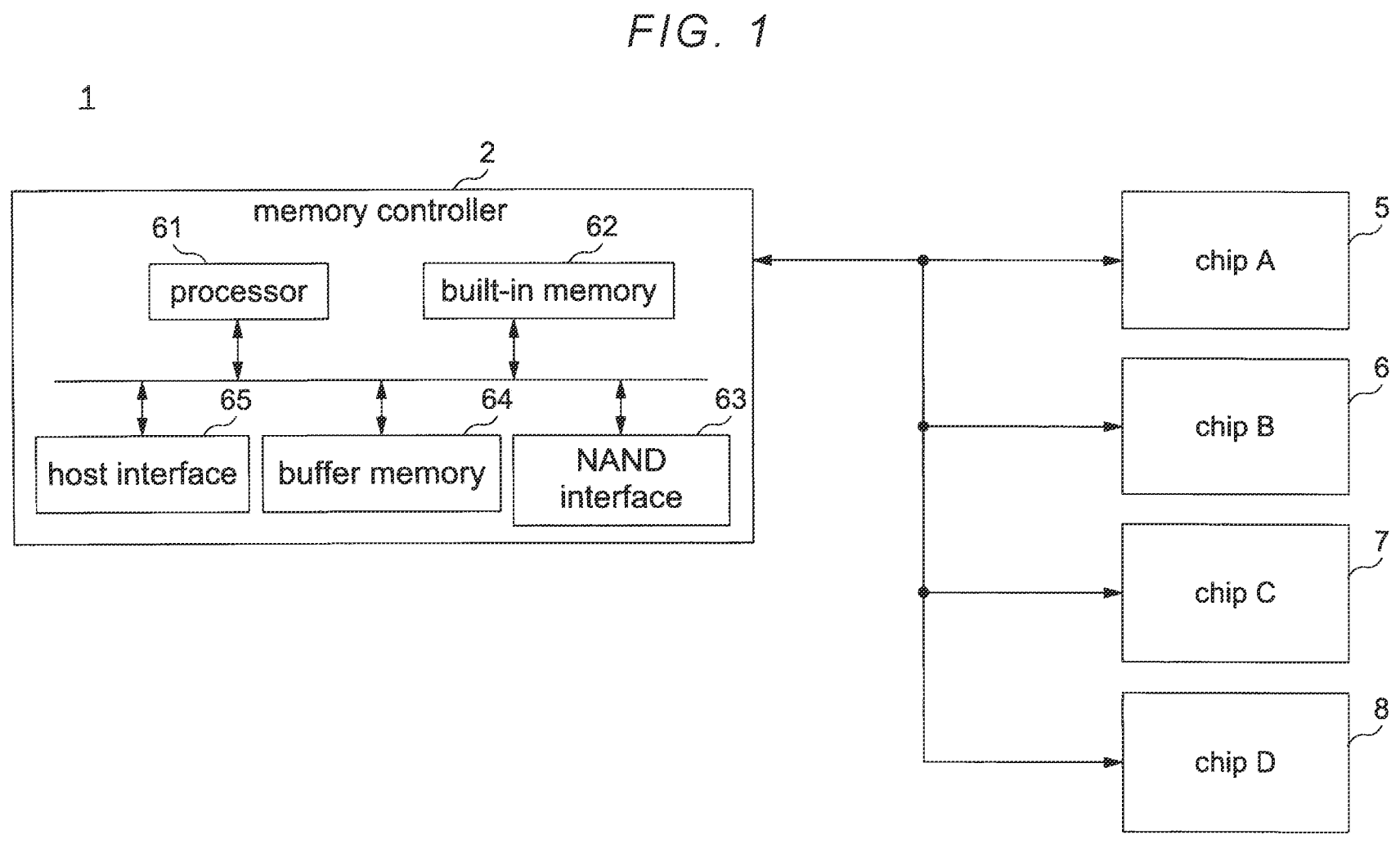

FIG. 1 a block diagram illustrating a configuration of a memory system according to an embodiment.

FIG. 5 is a diagram illustrating an equivalent circuit of adjacent strings in the semiconductor memory device according to the embodiment.

FIG. 9 is a diagram illustrating an ON/OFF state of each memory cell transistor of the string provided in a search target block in a search operation according to the embodiment.

FIG. 10 is a diagram illustrating a relationship between stored data and a write state in the search operation according to the embodiment.

FIG. 11 is a diagram illustrating a relationship between search data and voltage supplied to a word line corresponding to a search target memory cell in the search operation according to the embodiment.

FIG. 12 is a diagram illustrating a conductive state between a bit line and a source line determined by combining the stored data and the search data in the search operation according to the embodiment.

FIG. 15 is a diagram illustrating voltage supplied to a word line of the search target block in search target data in the search operation according to the embodiment.

FIG. 16 is a schematic diagram illustrating a configuration of a memory cell array of a semiconductor memory device according to an embodiment.

DETAILED DESCRIPTION

Figure 2:
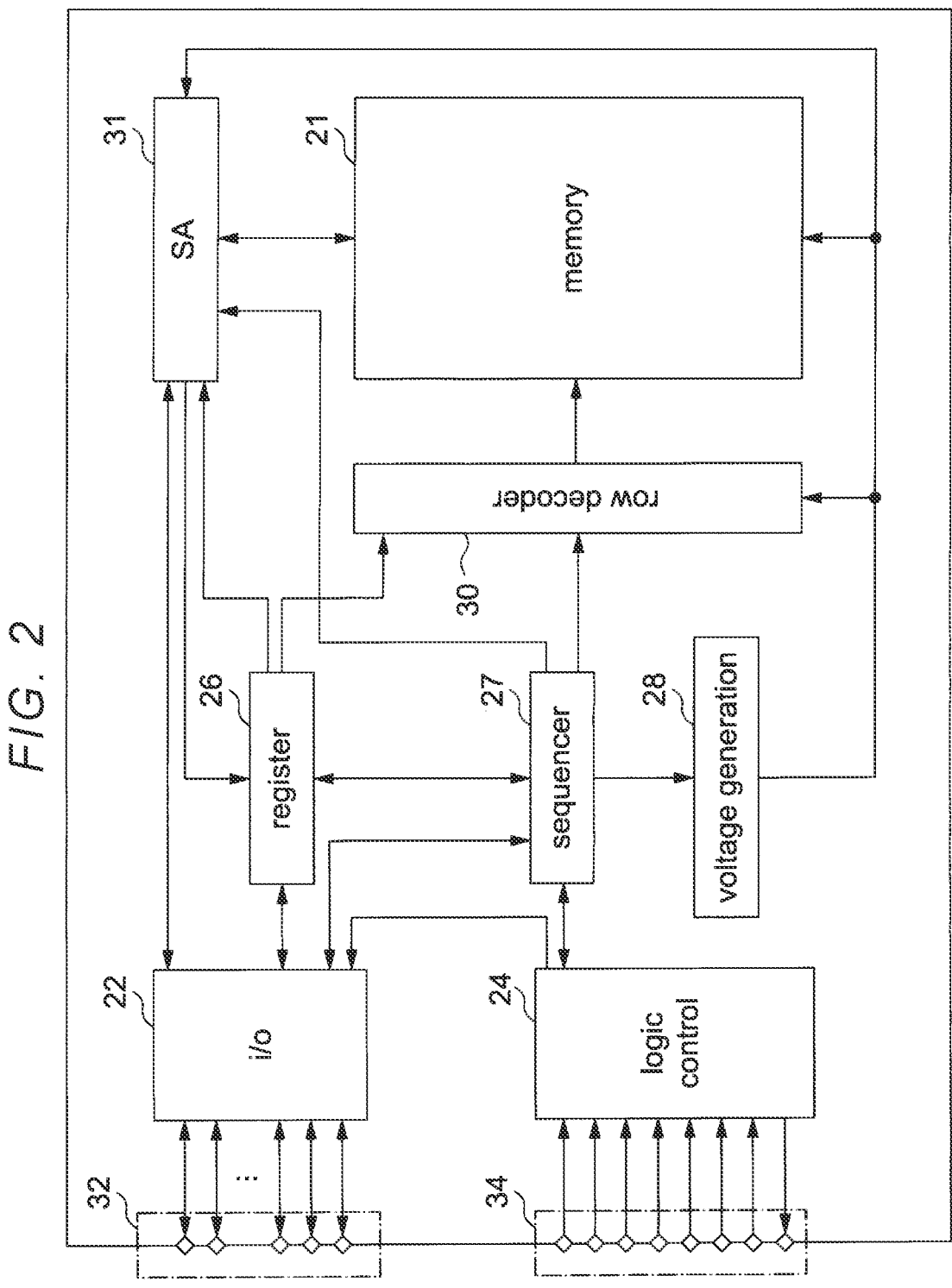
FIG. 2 is a block diagram illustrating a configuration of a semiconductor memory device according to the embodiment.

Embodiments provide a new search operation and sense operation for a memory device.

In general, according to one embodiment, a memory device includes a bit line, a source line, a first string in which a plurality of first memory cells are connected in series between the bit line and the source line, and a control circuit. The control circuit performs a sense operation for a search operation to determine if search data is stored in the plurality of first memory cells by supplying voltages to a plurality of word lines respectively corresponding to the plurality of first memory cells based on the search data and determining a similarity between the search data and data actually stored in the plurality of first memory cells based on a change in voltage of the bit line caused by current flowing between the bit line and the source line via the first string. The control circuit performs a read operation on a selected first memory cell to determine a value of data stored in the selected memory cell by supplying a source voltage to the source line, supplying a first read voltage to a word line corresponding to the selected first memory cell, and supplying a second read voltage to word lines corresponding to the first memory cells other than the selected first memory cell. A difference between the second read voltage and the source voltage is less than a difference between the first read voltage and the source voltage.

Hereinafter, a memory device according to an embodiment will be described specifically with reference to the drawings. In the following description, elements that have substantially the same functions and configurations are denoted by the same reference numerals, and will be described repeatedly only in necessary cases. In each embodiment to be described below, a device or a method for implementing technical ideas according to the embodiment will be exemplified. Materials, shapes, structures, dispositions, and the like of elements in the technical ideas according to the embodiments are not limited to the following materials, shapes, structures, dispositions, and the like. Various changes in the claims may be added in technical ideas according to embodiments.

1. First Embodiment

A memory device according to a first embodiment will be described with reference to FIGS. 1 to 15.

1-1. Overall Configuration of Memory System

FIG. 1 a block diagram illustrating a configuration of a memory system according to an embodiment. As illustrated in FIG. 1, a memory system 1 according to the first embodiment includes a memory controller 2 and semiconductor memory devices 5 to 8. The memory controller 2 is connected to the semiconductor memory devices 5 to 8 via a bus. Nonvolatile memories such as NAND flash memories are used as the semiconductor memory devices 5 to 8. The memory controller 2 controls operations of the semiconductor memory devices 5 to 8.

The memory controller 2 communicates with, for example, an external host device (not illustrated). The memory controller 2 executes a write operation and a read operation on the semiconductor memory devices 5 to 8 in response to a write request and a read request received from the host device. When the read operation is executed, the memory controller 2 transmits data stored in the semiconductor memory devices 5 to 8 to the host device.

The semiconductor memory devices 5 to 8 include a plurality of memory cells and store data in a nonvolatile manner. The semiconductor memory devices 5 to 8 are semiconductor chips which can be controlled independently. For example, the semiconductor memory devices 5 to 8 are designated for operation by individual chip enable signals. Otherwise, the semiconductor memory devices 5 to 8 are designated for operation by individual chip addresses assigned to the respective semiconductor memory devices in advance. Accordingly, the semiconductor memory devices 5 to 8 are independently controlled in response to instructions from the memory controller 2.

The memory controller 2 transmits various signals to the semiconductor memory devices 5 to 8 and receives various signals from the semiconductor memory devices 5 to 8 via the bus. The bus includes a plurality of signal lines, and transmits and receives signals in response to instructions transmitted from the memory controller 2. The signals transmitted and received via the bus include, for example, a chip enable signal, a command latch enable signal, an address latch enable signal, a write enable signal, a read enable signal, an output instruction signal, a write protection signal, a data signal (including a data strobe signal), and a ready busy signal.

As illustrated in FIG. 1, the memory controller 2 includes a processor 61, a built-in memory 62, a NAND interface circuit 63, a buffer memory 64, and a host interface circuit 65.

The processor 61 is, for example, a central processing unit (CPU) and controls an operation of the entire memory controller 2. For example, the processor 61 issues a write instruction for the semiconductor memory devices 5 to 8 via the NAND interface circuit 63 in response to a write request to write data received from the outside. The processor 61 functions in a similar manner for a read operation and an erasing operation.

The built-in memory 62 is, for example, a semiconductor memory such as a random access memory (RAM) or a dynamic RAM (DRAM) and is used as a work area of the processor 61. The built-in memory 62 stores firmware, various management tables, and the like for managing the semiconductor memory devices 5 to 8.

The NAND interface circuit 63 is connected to the semiconductor memory devices 5 to 8 via the above-described bus to communicate with the semiconductor memory devices 5 to 8. The NAND interface circuit 63 transmits commands, addresses, and write data to the semiconductor memory devices 5 to 8 in response to instructions of the processor 61. The NAND interface circuit 63 receives statuses and read data from the semiconductor memory devices 5 to 8.

The buffer memory 64 temporarily stores data and the like received from the semiconductor memory devices 5 to 8 and the outside by the memory controller 2.

The host interface circuit 65 is connected to the external host device (not illustrated) to communicate with the host device. The host interface circuit 65 transmits, for example, instructions and data received from the host device to the processor 61 and the buffer memory 64, respectively.

1.2 Configuration of Semiconductor Memory Device

A configuration example of the semiconductor memory device according to the first embodiment will be described with reference to FIG. 2. The semiconductor memory devices 5 to 8 have the same configuration. Therefore, in the following description, a configuration of the semiconductor memory device 5 among the semiconductor memory devices 5 to 8 will be described. Description of the configurations of the semiconductor memory devices 6 to 8 will be omitted.

As illustrated in FIG. 2, the semiconductor memory device 5 includes a memory cell array 21 (memory), an input/output circuit 22 (i/o), a logic control circuit 24 (logic control), a register 26 (register), a sequencer 27 (sequencer), a voltage generation circuit 28 (voltage generation), a row decoder 30 (row decoder), a sense amplifier 31 (SA), an input/output pad group 32, and a logic control pad group 34.

As will be described in detail below, the memory cell array 21 includes a plurality of nonvolatile memory cells (not illustrated) associated with word lines and bit lines.

The input/output circuit 22 transmits and receives data to and from the memory controller 2. The input/output circuit 22 transmits a command and an address in a data signal to the register 26. The input/output circuit 22 transmits and receives write data and read data to and from the sense amplifier 31.

The logic control circuit 24 receives, for example, a chip enable signal, a command latch enable signal, an address latch enable signal, a write enable signal, a read enable signal, an output instruction signal, and a write protection signal from the memory controller 2. The logic control circuit 24 transmits a read busy signal to the memory controller 2 to notify the memory controller 2 of a state of the semiconductor memory device 5.

The register 26 stores a command and an address. The register 26 transmits the address to the row decoder 30 and the sense amplifier 31 and transmits the command to the sequencer 27. The sequencer 27 receives the command and controls the entire semiconductor memory device 5 according to a sequence based on the received command. The sequencer 27 is also referred to as a "control circuit" in some cases.

The voltage generation circuit 28 generates voltages necessary for a write operation, a read operation, an erasing operation, and the like based on instructions from the sequencer 27. The voltage generation circuit 28 includes a plurality of drivers and supplies the generated voltages to the memory cell array 21, the row decoder 30, and the sense amplifier 31 under the control of the sequencer 27. For example, the voltage generation circuit 28 supplies the generated voltages to the corresponding row decoder 30 based on row addresses provided in instructed addresses.

The row decoder 30 selects memory cells corresponding to the row addresses provided in the instructed addresses under the control of the sequencer 27. The voltages supplied from the voltage generation circuit 28 via the row decoder 30 are applied to the memory cells at selected rows. As will be described in detail below, in the embodiment, the sequencer 27 (control circuit) controls the row decoder 30 to execute a search operation and a sense operation using certain data as a query and determine similarity of the data.

The sense amplifier 31 senses voltage of a bit line and stores the sensed voltage of the bit line in the register 26 during the sense operation after the search operation. The sequencer 27 (control circuit) determines the similarity of the data based on the voltage of the bit line stored in the register 26. The sense amplifier 31 detects read data read from the memory cell to the bit line and transmits the detected read data to the input/output circuit 22 during the read operation for the data. The sense amplifier 31 transmits write data to be written into the memory cell via the bit line during the write operation for the data. The sense amplifier 31 transmits data corresponding to column addresses provided in the instructed addresses to the input/output circuit 22 under the control of the sequencer 27.

The input/output pad group 32 transmits the data signal received from the memory controller 2 to the input/output circuit 22. The input/output pad group 32 transmits the data signal received from the input/output circuit 22 to the memory controller 2. The logic control pad group 34 transmits various signals received from the memory controller 2 to the logic control circuit 24.

1-3. Configuration of Memory Cell Array

Figure 3:
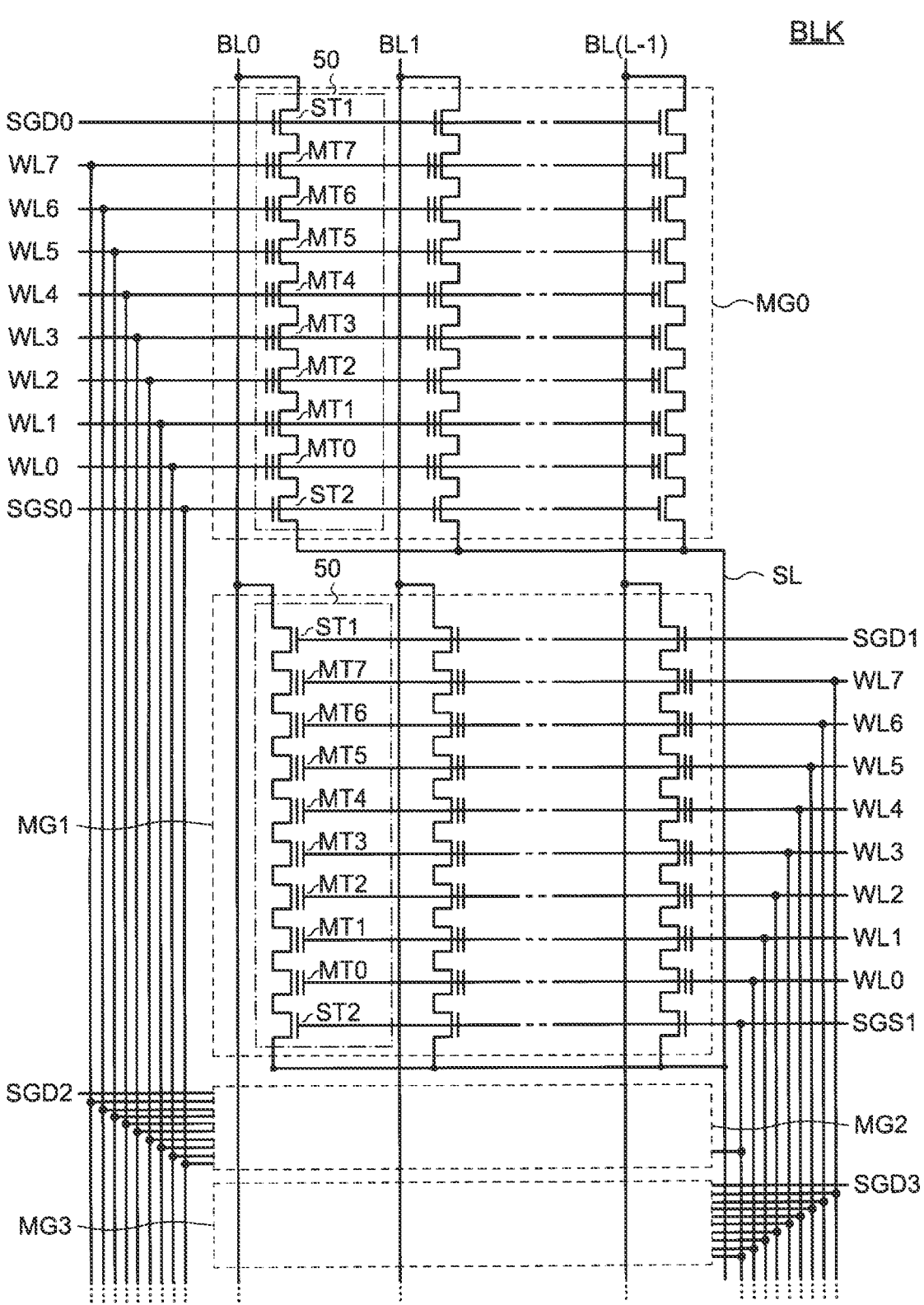
FIG. 3 is a diagram illustrating a circuit configuration of a memory cell array of the semiconductor memory device according to the embodiment.

A circuit configuration of the memory cell array 21 will be described with reference to FIG. 3. FIG. 3 is an equivalent circuit diagram of a block BLK. As illustrated, the block BLK includes a plurality of memory groups MG (MG0, MG1, MG2, . . . ). The memory group MG includes a plurality of strings 50.

In FIG. 3, the string 50 includes eight memory cell transistors MT (MT0 to MT7) and select transistors ST (ST1 and ST2). The eight memory cell transistors MT are connected in series between a source of the select transistor ST1 and a drain of the select transistor ST2.

In the embodiment, as the memory cell transistor MT and the select transistor ST, "depression type" transistors are used. The depression type means that a transistor is in a conductive state (ON state) when source voltage of the transistor serves as a reference and gate voltage (hereinafter referred to as a "gate voltage with respect to source voltage") is 0 V.

For example, for a depression type and N-type transistor, when 0 V is supplied (applied) as source voltage and 0 V is supplied (applied) as gate voltage, the transistor enters an ON state. When the gate voltage with respect to the source voltage is negative voltage (equal to or less than threshold voltage of the transistor), the depression type and N-type transistor enters a non-conductive state (OFF state). For example, when 0 V is supplied (applied) as the source voltage and $-5$ V is supplied (applied) as the gate voltage (the threshold voltage of the transistor is equal to or greater than $-5$ V), the transistor enters an OFF state.

For a depression type and P-type transistor, when 0 V is supplied (applied) as the source voltage and 0 V is supplied (applied) as the gate voltage, the transistor enters an ON state like the N-type transistor. Conversely, when the gate voltage with respect to the source voltage is positive voltage (equal to or greater than the threshold voltage of the transistor), the depression type and P-type transistor enters an OFF state. For example, when 0 V is supplied (applied) as the source voltage and 5 V is supplied (applied) as the gate voltage (the threshold voltage of the transistor is equal to or less than 5 V), the transistor enters an OFF state.

In the embodiment, a configuration in which the number of memory cell transistors MT provided in the string 50 is eight has been exemplified, but embodiments are not limited thereto. For example, the number of memory cell transistors MT provided in the string 50 may be seven or less or nine or more. The number of select transistors ST is not limited to the foregoing configuration. For example, a current control memory cell LCC to be described below may be provided between the memory cell transistor MT0 and the select transistor ST2.

As will be described in detail below, the memory cell transistor MT includes a gate electrode GE that controls an ON state and an OFF state of the transistor and a charge storage layer CT that stores charges injected through a write operation (see FIG. 5). The memory cell transistor MT has threshold voltage Vth according to a charge amount stored by the charge storage layer. When voltage equal to or greater than the threshold voltage Vth (in the case of an N-type transistor) or voltage equal to or less than the threshold voltage Vth (in the case of a P-type transistor) is applied to the gate electrode GE, the memory cell transistor MT enters an ON state.

When a write operation on the memory cell transistor MT is executed, that is, electrons are injected into the charge storage layer CT of the memory cell transistor MT, the threshold voltage Vth of the memory cell transistor MT is changed. The threshold voltage Vth of the memory cell transistor MT when electrons are injected into the charge storage layer CT is higher than the threshold voltage Vth of the memory cell transistor MT when electrons are not injected to the charge storage layer CT (the threshold voltage Vth of the memory cell transistor MT when the electrons are injected into the charge storage layer CT>the threshold voltage Vth of the memory cell transistor MT when the electrons are not injected into the charge storage layer CT).

The memory cell transistor MT stores data in a nonvolatile manner according to a change in the threshold voltage Vth caused by the injection of the electrons into the charge storage layer CT.

A gate of the select transistor ST1 in the memory group MG is connected to select gate lines SGD (SGD0, SGD1, . . . ). The select gate lines SGD are independently controlled by the row decoder 30.

Gate electrodes GE of the memory cell transistors MT0 to MT7 provided in the same memory group MG and belonging to different bit lines BL are connected to word lines WL0 to WL7, respectively. The word lines WL (WL0 to WL7) are independently controlled by the row decoder 30.

The blocks BLK are, for example, units of erasing of data. That is, data stored by the memory cell transistors MT provided in the same block BLK are erased together. As will be described in detail below, the threshold voltage Vth of the memory cell transistor MT when data is erased (an erased state) is lower than the threshold voltage Vth of the memory cell transistor MT when data is written (a written state) (the threshold voltage Vth of the memory cell transistor MT when the data is erased (the erased state)<the threshold voltage Vth of the memory cell transistor MT when the data is written (the written state)).

In the memory cell array 21, drains of the select transistors ST1 of the plurality of strings 50 provided at the same column are connected to a common bit line BL (BL0 to BL(L−1) (where L is a natural number of 3 or more)). In the memory cell array 21, sources of the plurality of select transistors ST2 are commonly connected to the source line SL.

1-4. Cross-Sectional Structure of Memory Cell Array

A certain cross-sectional structure of the memory cell array 21 will be described with reference to FIG. 4. The memory cell array 21 includes wiring layers 10 to 12, a semiconductor substrate 13, contact plugs 16, memory pillars MP, and bit lines BL.

Figure 4:
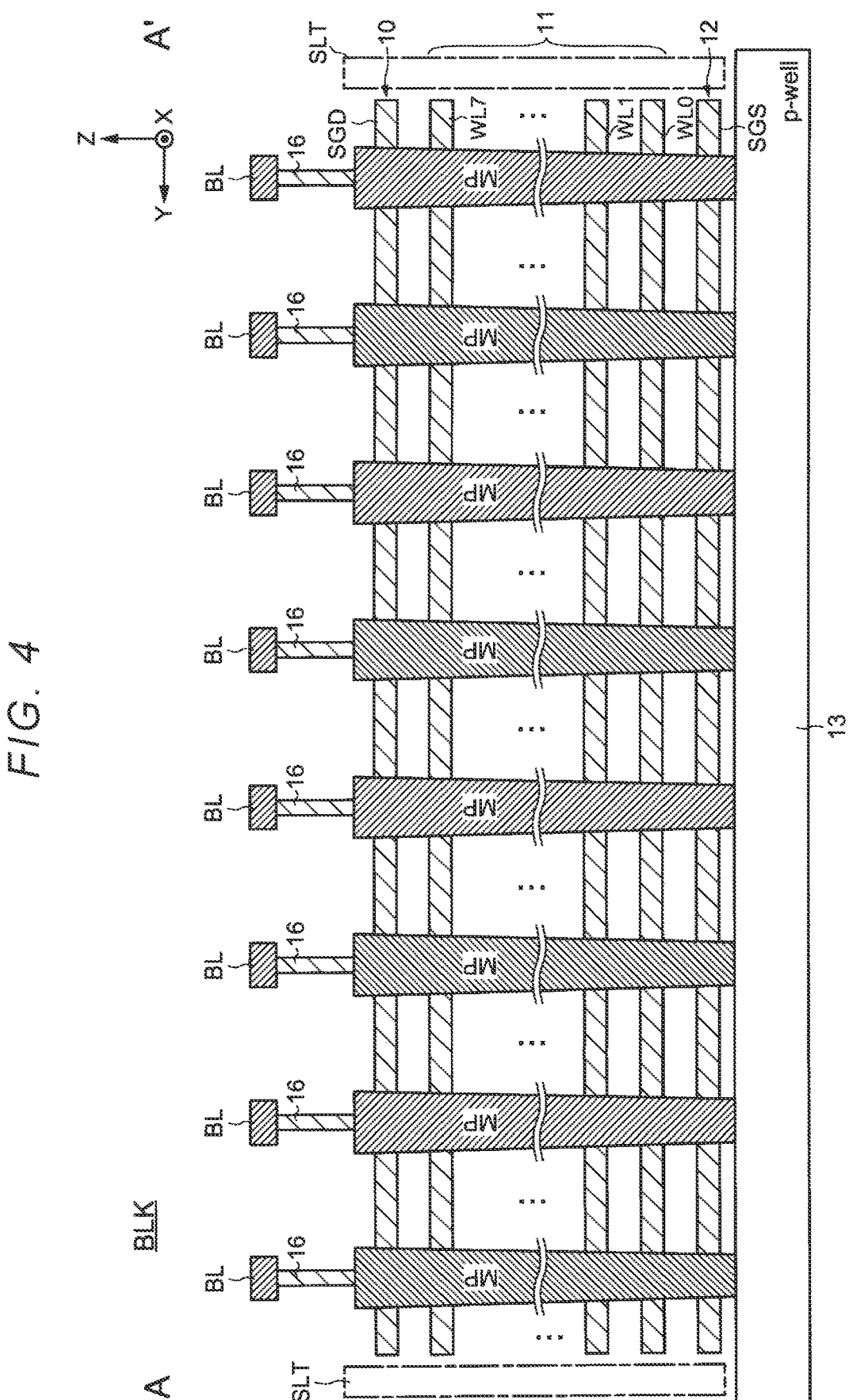
FIG. 4 is a sectional view illustrating the semiconductor memory device according to the embodiment.

As illustrated in FIG. 4, the wiring layer 12 functioning as a select gate line SGS is provided above the semiconductor substrate 13. Eight wiring layers 11 functioning as the word lines WL0 to WL7 are provided above the wiring layer 12. The eight wiring layers 11 are stacked in a Z axis direction. The wiring layer 10 functioning as the select gate line SGD is provided above the wiring layers 11.

The memory pillars MP include semiconductor layers, insulating layers, and conductive layers. The layers continuously extend in the Z axis direction and are stacked in an X axis direction and a Y axis direction. Specifically, the layers are formed in cylindrical shapes. The charge storage layer CT and a channel unit CH to be described below are formed by the layers. As the semiconductive layer, for example, monocrystalline or polycrystalline silicon is used. Here, a material other than silicon may be used as the semiconductor layer. The semiconductor layer may be a non-crystalline layer or a non-crystalline and polycrystalline mixed layer.

When the memory cell transistor MT provided in the memory pillar MP is an N-type transistor, the semiconductor layer includes, for example, phosphorous or arsenic as an N-type dopant. When the memory cell transistor MT provided in the memory pillar MP is a P-type transistor, the semiconductor layer includes, for example, boron as a P-type dopant.

In the Y axis direction, the memory pillars MP are arranged and extend through the wiring layer 10 (the select gate line SGD), the wiring layers 11 (the word lines WL), and the wiring layer 12 (the select gate line SGS) in the Z axis direction. The memory pillars MP are arranged also in the X axis direction and extend through the wiring layers in the Z axis direction. That is, on an XY plane, the circumferences of the memory pillars MP are surrounded by the wiring layers. However, the embodiment is not limited to such structure, and the wiring layers 10 to 12 only needs to face the memory pillars MP.

Slits SLT are provided between the blocks BLK adjacent in the Y axis direction. In the slit SLT, an insulating layer is provided. Here, a contact plug or the like for supplying (applying) voltage to a region provided in the semiconductor substrate 13 may be provided in the slit SLT. For example, a contact plug or a groove-shaped conductor for connecting a source of the select transistor ST2 to the source line may be provided in the slit SLT.

The bit line BL is provided above the memory pillar MP. The contact plug 16 connecting the memory pillar MP to the bit line BL is provided between the memory pillar MP and the bit line BL.

1-5. Equivalent Circuit

FIG. 5 is a diagram illustrating an equivalent circuit of adjacent strings in the semiconductor memory device according to the embodiment. As illustrated in FIG. 5, one string 50 is provided in one memory pillar MP. In FIG. 5, two memory pillars MP1 and MP2 are illustrated. the suffix "-1" is added to reference numerals of the memory cell transistor MT and the select transistor ST belonging to the memory pillar MP1, and the suffix "-2" is added to reference numerals of the memory cell transistor MT and the select transistor ST belonging to the memory pillar MP2. In the following description, when it is not necessary to distinguish the memory cell transistors MT and the select transistors ST belonging to the memory pillars MP1 and MP2 from each other, the suffixes "-1" and "-2" are not referenced in description.

The string 50 includes the select transistor ST1, 2n (where n is an integer of 1 or more: 4 in the embodiment) memory cell transistors MT, and the select transistor ST2 provided between the bit line BL and the source SL and connected in series. In the embodiment, as n is 4, the memory cell transistors MT0 to MT7 are provided. The 2n memory cell transistors MT are connected in series between the select transistor ST1 and the select transistor ST2. As illustrated in FIG. 4, the 2n memory cell transistors MT are disposed in the Z axis direction.

The source line SL is provided on a main surface of the semiconductor substrate 13 (see FIG. 4). The source line SL may be configured such that an un-patterned conductive layer extends in a region of the memory cell array 21 or may be configured such that a conductive layer patterned in a line shape extends in the region. In other words, the source line SL extends in the X axis direction and the Y axis direction. The source line SL may be formed of a conductive semiconductor by which a part of the semiconductor substrate 13 has conductivity or may be formed of a metal material formed on the semiconductor substrate 13.

The word lines WL of 2n layers (where n is an integer of 1 or more) are each provided above the source line SL (in the Z axis direction). When the source line SL serves as a reference, the position of an i-th word line WL is the same as the position of an i-th memory cell transistor MT in the Z axis direction (see FIG. 4). That is, when the source line SL serves as a reference, the positions of an i-th word line WL and an i-th memory cell transistor MT are the same in the Z axis direction. The select transistor ST1 is connected to the select gate line SGD1. The select transistor ST2 is connected to the select gate line SGS1.

The strings 50-1 and 50-2 are each connected to the common bit line BL and the common source line SL. The word lines WL0-1 to WL7-1 are controlled independently from the word lines WL0-2 to WL7-2. The select gate lines SGD1-1 and SGS1-1 are controlled independently from the select gate lines SGD1-2 and SGS1-2.

In FIG. 5, the memory cell transistor MT includes the channel unit CH, the charge storage layer CT, and the gate electrode GE. The channel unit CH is a portion that functions as a channel of the memory cell transistor MT. The charge storage layer CT stores charges injected through a write operation. The threshold voltage Vth of the memory cell transistor MT is changed according to a charge amount stored in the charge storage layer CT. The gate electrode GE is connected to the word line WL. The channel unit CH, the charge storage layer CT, and the gate electrode GE are insulated from each other by an insulating layer.

The select transistor ST includes the channel unit CH and the gate electrode GE. The select transistor ST includes no charge storage layer CT. The charge storage layer CT may be, for example, a floating gate such as a metal layer or the like, or a charge trap layer such as a silicon nitride layer. The write level is determined according to a charge amount stored in the charge storage layer CT.

The memory cell transistor MT may be a memory cell that includes a ferroelectric insulating layer. Then, the ferroelectric insulating layer is provided between the channel unit CH and the gate electrode GE, and a threshold voltage of the memory cell transistor MT is changed as a dielectric constant is changed. The string 50 is connected to the source line SL via the source electrode SE and is connected to the bit line BL via a drain electrode DE.

1-6. Threshold Voltage Distribution of Memory Cell Transistor

Figure 6:
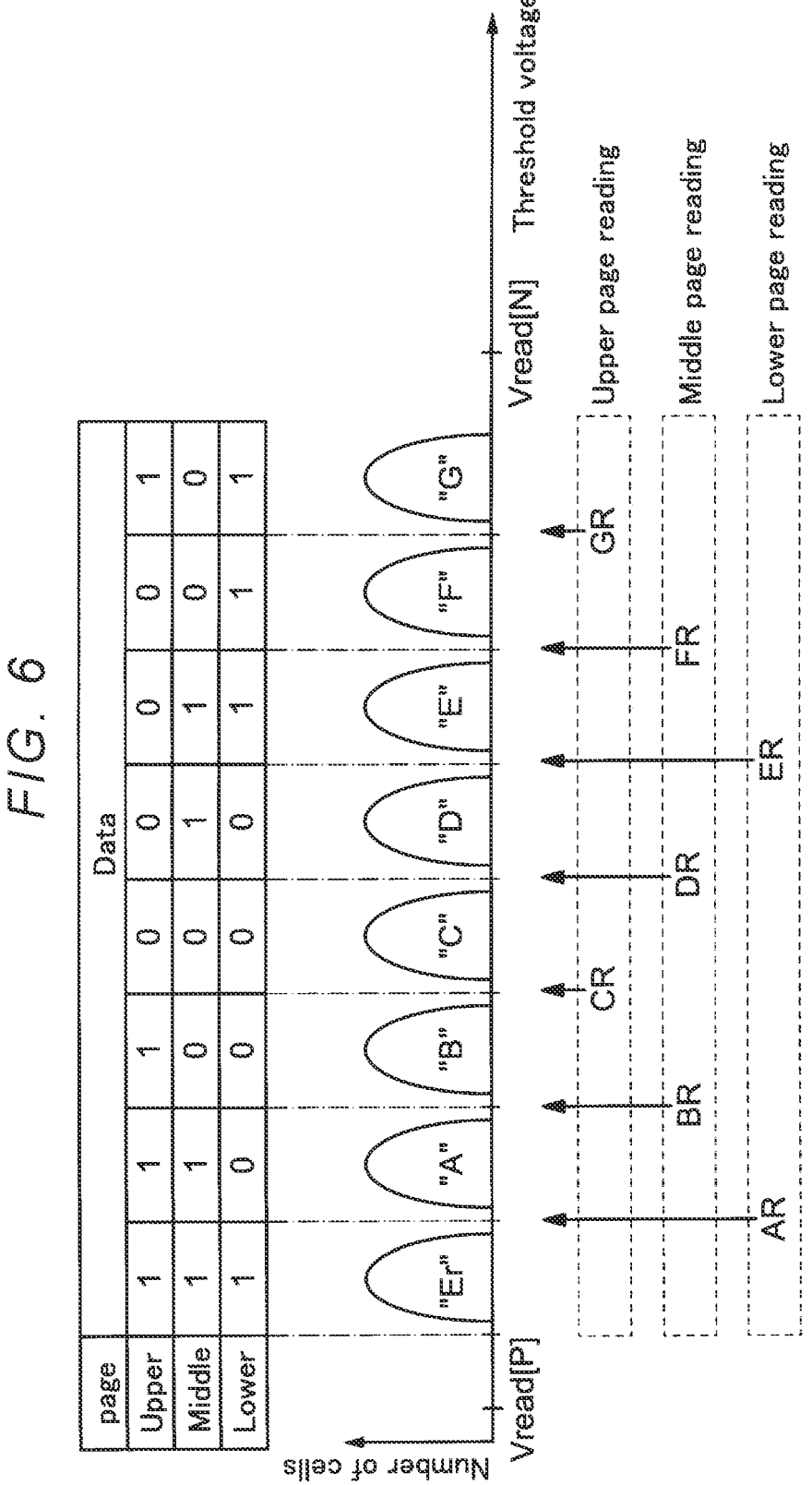
FIG. 6 is a diagram illustrating a threshold voltage distribution of a memory cell transistor according to the embodiment.

FIG. 6 is a diagram illustrating a threshold voltage distribution of the memory cell transistor used as the memory cell according to the embodiment. In FIG. 6, a triple level cell (TLC) will be described as an example of a threshold voltage distribution. However, a quad level cell (QLC), a multi-level cell (MLC), or a single level cell (SLC) may also be used in the memory system 1.

FIG. 6 illustrates examples of a threshold voltage distribution of the memory cell transistor, assignment of data, and threshold determination voltage. The vertical axis of the threshold voltage distribution corresponds to the number of memory cell transistors (Number of cells) and the horizontal axis corresponds to threshold voltage Vth (Threshold voltage) of the memory cell transistor.

A plurality of memory cell transistors in a TLC scheme (mode) have eight threshold voltage distributions. The eight threshold voltage distributions are referred to as write levels. In the embodiment, a state of a threshold voltage distribution is referred to as a "write level" in the following description (FIGS. 6, 8. 10, 14, 22, 26, and 29), but is also referred to as a "write state" in some cases. The write states are referred to as an "Er" state, an "A" state, a "B" state, a "C" state, a "D" state, an "E" state, an "F" state, and a "G" state in ascending order of threshold voltages. In the write states, for example, different pieces of 3-bit data are assigned as follows. The pieces of 3-bit data are referred to as a lower bit, a middle bit, and an upper bit.

In the embodiment, the write states correspond to the 3-bit data as follows.

"Er" state: "111" data
"A" state: "110" data
"B" state: "100" data
"C" state: "000" data
"D" state: "010" data
"E" state: "011" data
"F" state: "001" data
"G" state: "101" data The data is described in the order of Upper, Middle, and Lower.

A set of lower bits stored by the memory cell transistors connected to the same word line is referred to as a lower page, a set of middle bits is referred to as a middle page, and a set of upper bits is referred to as upper page. A write operation and a read operation for data are executed in units of pages.

Between adjacent threshold voltage distributions, threshold determination voltage used in each read operation is set. For example, threshold determination voltage AR for determining whether threshold voltage of the memory cell transistor is provided in the "Er" state or provided in the "A" state or more is set between a maximum threshold voltage at the "Er" state and a minimum threshold voltage at the "A" state.

Other threshold determination voltages BR, CR, DR, ER, FR, and GR are also set between adjacent levels like the threshold determination voltage AR. For example, the threshold determination voltage BR is set between the "A" state and the "B" state. The threshold determination voltage CR is set between the "B" state and the "C" state. The threshold determination voltage DR is set between the "C" state and the "D" state. The threshold determination voltage ER is set between the "D" state and the "E" state. The threshold determination voltage FR is set between the "E" state and the "F" state. The threshold determination voltage GR is set between the "F" state and the "G" state. The threshold determination voltages AR to GR may be appropriately set in a stepwise manner in the range of −9 V to −2 V in the case of an N-type memory cell transistor MT and in the range of 2 V to 9 V in the case of a P-type memory cell transistor MT.

During a read operation, read voltage Vread for causing the memory cell transistor MT corresponding to an non-selected WL to enter an ON state is supplied (applied) to the non-selected WL. When the memory cell transistor MT is an N-type transistor, read voltage Vread[N] is set to a voltage value higher than a maximum threshold voltage of a highest threshold voltage distribution (for example, the "G" state). When the memory cell transistor MT is a P-type transistor, read voltage Vread[P] is set to a voltage value lower than a minimum threshold voltage of a lowest threshold voltage distribution (for example, the "Er" state). In either case, the memory cell transistor MT in which the read voltage Vread is applied to the gate enters an ON state regardless of stored data.

In accordance with the data assignment, one piece of page data of lower bits (data of the lower page) in the read operation is confirmed according to a reading result of the threshold determination voltages AR and ER. Likewise, one piece of page data of the middle bits (data of the middle page) is confirmed according to a reading result of the threshold determination voltages BR, DR, and FR, and one piece of page data of upper bits (data of the upper page) is confirmed according to a reading result of the threshold determination voltages CR and GR. As such, since the pieces of data of the lower page, the middle page, and the upper page are confirmed by the read operation executed twice, three times, and twice, respectively, the assignment of the data is referred to as "2-3-2 code".

1-7. Configuration of String

Figure 7:
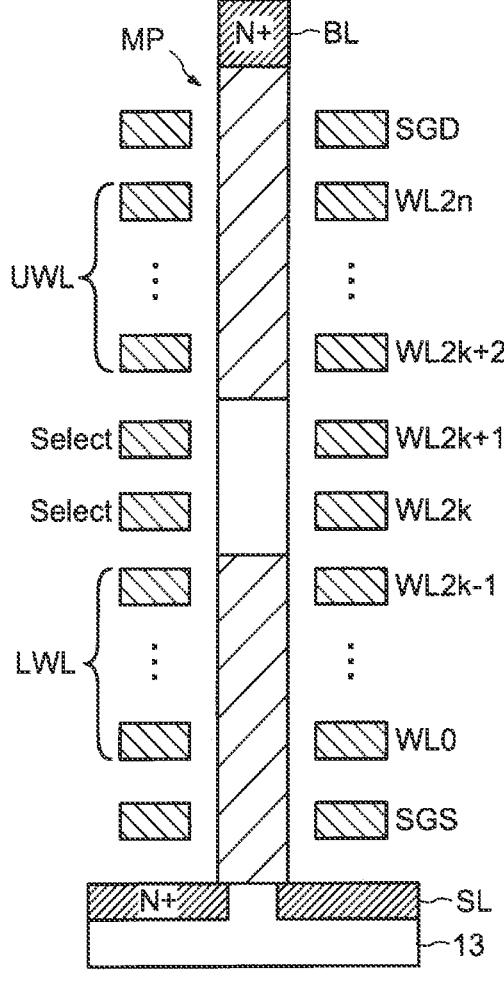
FIG. 7 is a diagram illustrating a configuration of the string according to the embodiment.

FIG. 7 is a diagram illustrating a configuration of the string according to the embodiment. In FIG. 7, one string 50 provided in a search target block is illustrated. In FIG. 7, word lines (WL0 to WL2n) of 2n layers (where n is a natural number of 1 or more) between the select gate lines SGS and SGD are illustrated.

In the embodiment, for example, data searched for in the memory system 1 by a user or a host 20 is referred to as "search data" or "query data". The search data is not stored in the memory cell array 21 and is input from the outside of the memory system 1. For example, the search data (query data) is provided in a command transmitted from the host 20.

In FIG. 7, word lines WL2k and WL2k+1 corresponding to a search target memory cell are selected. In the embodiment, similarity is determined based on contrast between the search data and data (stored data) stored in the memory cell.

As illustrated in FIG. 7, the word lines WL2k and WL2k+1 of a search target memory cell transistor MT are displayed as "Select". A word line of a memory cell transistor MT provided above the search target is displayed as "UWL". A word line of a memory cell transistor MT provided below the search target is displayed as "LWL".

In the following search operation and sense operation, the select gate lines SGS and SGD are supplied with voltage for controlling the ON state and the OFF state of the corresponding select transistor ST. Non-selected word lines WL0 to WL2k−1 and WL2k+2 to WL2n other than the word lines WL2k and WL2k+1 selected as described above are supplied with the read voltage Vread for causing the memory cell transistor MT to enter an ON state. Voltage supplied to the word lines WL2k and WL2k+1 will be described below.

In FIG. 7, the memory pillar MP corresponding to the memory cell transistor MT provided with the read voltage Vread and entering the ON state is indicated by hatching. The source line SL and the bit line BL provided on the semiconductor substrate 13 of a region in contact with the memory pillar MP is a semiconductor that has low resistance by containing an N-type dopant. Such a semiconductor is indicated by "N+". The source line SL is supplied with 0 V as the source voltage. Bit voltage supplied to the bit line BL is voltage (for example, 0.5 V) higher than source voltage.

In the embodiment, when a depression type transistor is used as each memory cell transistor MT, the transistor is controlled by a method different from that of a memory cell transistor MT in which a normal enhancement type transistor is used. Specifically, voltage supplied to the source line SL is referred to as a "source voltage". When voltage supplied to a word line WL corresponding to a memory cell transistor MT selected as a read operation target is referred to as "first read voltage" and voltage supplied to a word line WL corresponding to an non-selected memory cell transistor MT which is not a read operation target is referred to as "second read voltage", a difference between the second read voltage and the source voltage is less than a difference between the first read voltage and the source voltage.

When the memory cell transistor MT is the depression type and N-type transistor, as described above, the source voltage is 0 V and the bit voltage is 0.5 V in the read operation. When voltage supplied to a word line WL corresponding to a memory cell transistor MT selected as a read operation target is referred to as "first read voltage" and voltage supplied to a word line WL corresponding to an non-selected memory cell transistor MT which is not a read operation target is referred to as "second read voltage", 0 V is supplied as the second read voltage to the word line WL corresponding to the non-selected memory cell transistor MT and any voltage of −9 V to −2 V is supplied as the first read voltage to the word line WL corresponding to the selected memory cell transistor MT.

In a search operation and a sense operation to be described below, the non-selected memory cell transistor MT and the selected memory cell transistor MT are controlled as described above. That is, in the search operation and the sense operation, the second read voltage is supplied to the memory cell transistors MT corresponding to the word lines WL indicated by the foregoing UWL and LWL.

Figure 8:
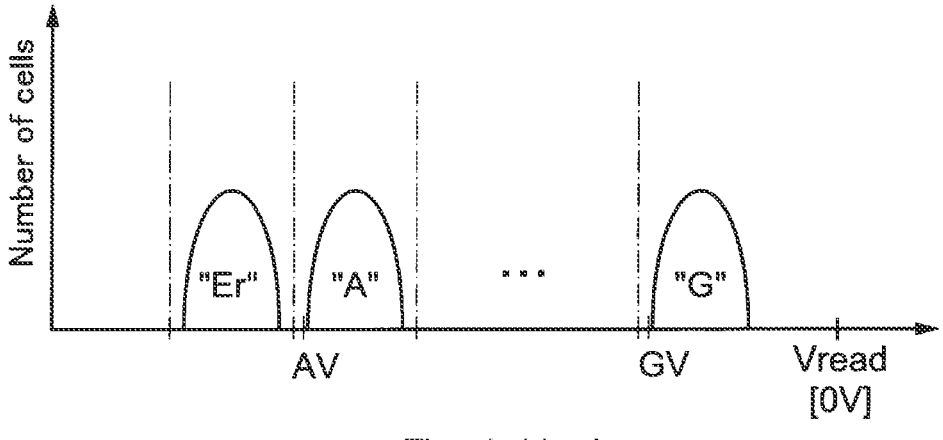
FIG. 8 is a diagram illustrating the threshold voltage distribution of the memory cell transistor according to the embodiment.

FIG. 8 is a diagram illustrating the threshold voltage distribution of the memory cell transistor according to the embodiment. As illustrated in FIG. 8, since the memory cell transistor MT according to the embodiment is the depression type and N-type transistor, the memory cell transistor MT has a write level in a voltage range less than 0 V. The read voltage Vread in FIG. 8 is 0 V. Accordingly, among a plurality of write levels that can be taken by the memory cell transistor MT, the threshold voltage distribution ("G" state) which is the highest voltage can be said to be source voltage (0 V) or less.

When the search operation and the sense operation are executed on the target memory cell transistor MT, voltage supplied to the word line WL connected to the memory cell transistor MT is 0 V or less even when a write level of the memory cell transistor MT is any level of the "Er" state to the "G" state.

1-8. Search Operation

FIG. 9 is a diagram illustrating an ON/OFF state of each memory cell transistor of the string provided in a search target block in a search operation according to the embodiment. FIG. 9 illustrates bias voltage (WL_bias) supplied to each word line WL, threshold voltage (MT_Vth) of the memory cell transistor MT corresponding to each word line, and an ON/OFF state (On/Off) of the memory cell transistor MT in the string 50 illustrated in FIG. 7.

As illustrated in FIG. 9, 0 V is supplied as bias voltage to word lines WL0 to WL2k−1 and WL2k+2 to WL2n. As described above, 0 V is supplied to the semiconductor substrate 13, and thus each memory cell transistor MT is a depression type and N-type transistor. Accordingly, even when data stored in each memory cell transistor MT is any data (Any), the memory cell transistor MT is in an ON state.

The ON/OFF state of the memory cell transistors MT corresponding to the word lines WL2k and WL2k+1 is determined according to search data and stored data, as will be described below.

Data stored in the memory cell transistors MT corresponding to the search target word lines WL2k and WL2k+1 and search results obtained from the data will be described with reference to FIGS. 10 to 12.

FIG. 10 is a diagram illustrating a relationship between stored data and a write state in the search operation according to the embodiment. FIG. 10 illustrates a relationship between the threshold voltages Vth (write levels) of the memory cell transistors MT corresponding to the word lines WL2k and WL2k+1 in the search target block and stored data (Stored Data) corresponding to the threshold voltages Vth. The threshold voltages Vth correspond to the write level illustrated in FIG. 6.

As illustrated in FIG. 10, stored data is "0" when the threshold voltages of the memory cell transistors MT corresponding to the word lines WL$2k$ and WL$2k$+1 are respectively "Er" and "A". Conversely, stored data is "1" when the threshold voltages of the memory cell transistors MT corresponding to the word lines WL$2k$ and WL$2k$+1 are respectively "A" and "Er".

FIG. 11 is a diagram illustrating a relationship between search data and voltage supplied to a word line corresponding to a search target memory cell in the search operation according to the embodiment. FIG. 11 illustrates the search data (Search Data) in the search target block and bias voltages supplied to the word lines WL$2k$ and WL$2k$+1 corresponding to the search data. "H" displayed as bias voltage is determined based on the search data. In the embodiment, as illustrated in FIG. 10, since it is necessary to distinguish the write levels "Er" and "A", "H" is set as voltage between the write levels "Er" and "A". Here, "H" may be voltage between "Er" and "B" to "G". "X" displayed as search data is a wild card. That is, "X" is used when the search target stored data may be any one of "0" and "1".

As illustrated in FIG. 11, when the search data is "0", 0 V is supplied to the word line WL$2k$ and "H" is supplied to the word line WL$2k$+1. When the search data is "1", "H" is supplied to the word line WL$2k$ and 0 V is supplied to the word line WL$2k$+1. When the search data is "X", "H" is supplied to the word lines WL$2k$ and WL$2k$+1.

Referring to FIGS. 8, 10, and 11, when the threshold voltages Vth of the memory cell transistors MT corresponding to the search target word lines WL$2k$ and WL$2k$+1 are respectively "Er" and "A" (corresponding to the stored data "0" of FIG. 10) and the search data is "0" or "X", the memory cell transistor MT corresponding to the word line WL$2k$ (Er) is controlled to enter the ON state and the memory cell transistor MT corresponding to the word line WL$2k$+1 (A) is controlled to enter the OFF state. Conversely, when the search data is "1", the memory cell transistor MT corresponding to the word line WL$2k$ (A) and the memory cell transistor MT corresponding to the word line WL$2k$+1 (Er) are both controlled to enter the ON state.

As described above, when the threshold voltages Vth of the memory cell transistors MT corresponding to the search target word lines WL$2k$ and WL$2k$+1 are respectively "A" and "Er" (corresponding to the stored data "1" of FIG. 10) and the search data is "0", the memory cell transistor MT corresponding to the word line WL$2k$ (A) and the memory cell transistor MT corresponding to the word line WL$2k$+1 (Er) are both controlled to enter the ON state. Conversely, when the search data is "1" or "X", the memory cell transistor MT corresponding to the word line WL$2k$ (Er) is controlled to enter the OFF state and the memory cell transistor MT corresponding to the word line WL$2k$+1 (A) is controlled to enter the ON state.

FIG. 12 is a diagram illustrating a conductive state between a bit line and a source line determined by combining the stored data and the search data in the search operation according to the embodiment. In FIG. 12, the string 50 may enter the ON state when the bit line BL and the source line SL belonging to the string 50 are in a conductive state. The string 50 enters the OFF state in some cases when the bit line BL and the source line SL are in a non-conductive state.

As illustrated in FIG. 9, since the memory cell transistors MT corresponding to the word lines WL0 to WL$2k$−1 and WL$2k$+2 to WL$2n$ are all in the ON state, the ON/OFF state of the string 50 is determined according to the ON/OFF state of the memory cell transistors MT corresponding to the word lines WL$2k$ and WL$2k$+1. A relationship between stored data (Stored Data) and the threshold voltage Vth of the memory cell transistor MT illustrated in FIG. 12 is similar to the relationship illustrated in FIG. 10. Search data (Search Data) illustrated in FIG. 12 corresponds to the search data illustrated in FIG. 11.

As illustrated in FIG. 12, when the stored data and the search data are "0" together, the threshold voltage Vth of the memory cell transistor MT corresponding to the word line WL$2k$ is "Er" (see FIG. 10) and 0 V is supplied to the word line WL$2k$ (see FIG. 11). Therefore, the memory cell transistor MT is in the ON state. Similarly, when the threshold voltage Vth of the memory cell transistor MT corresponding to the word line WL$2k$+1 is "A" (see FIG. 10) and "H" is supplied to the word line WL$2k$+1 (see FIG. 11), the memory cell transistor MT is in the OFF state. As a result, when the stored data and the search data are "0" together, the string 50 is in the OFF state.

When the stored data is "0" and the search data is "1", the threshold voltage Vth of the memory cell transistor MT corresponding to the word line WL$2k$ is "Er", and "H" is supplied to the word line WL$2k$. Therefore, the memory cell transistor MT is in the ON state. Similarly, since the threshold voltage Vth of the memory cell transistor MT corresponding to the word line WL$2k$+1 is "A" and 0 V is supplied to the word line WL$2k$+1, the memory cell transistor MT is in the ON state. As a result, when the stored data is "0" and the search data is "1", the string 50 is in the ON state.

When the stored data is "0" and the search data is "X", the threshold voltage Vth of the memory cell transistor MT corresponding to the word line WL$2k$ is "Er", and "H" is supplied to the word line WL$2k$. Therefore, the memory cell transistor MT is in the ON state. Similarly, since the threshold voltage Vth of the memory cell transistor MT corresponding to the word line WL$2k$+1 is "A", and "H" is supplied to the word line WL$2k$+1, the memory cell transistor MT is in the OFF state. As a result, when the stored data is "0" and the search data is "X", the string 50 is in the OFF state.

As described above, when the stored data is "1" and the search data is "0", the string 50 is in the ON state. When the stored data and the search data are "1" together, the string 50 is in the OFF state. When the stored data is "1" and the search data is "X", the string 50 is in the ON state.

As described above, when the data stored in the search target block is the same as the search data, the string 50 is in the OFF state. When the search data is "X", the string 50 is in the OFF state. In the other cases, the string 50 is in the ON state.

When the bit line BL is not connected to a power line and the string 50 is on the OFF state, voltage supplied to the bit line BL is maintained as it is. Conversely, when the bit line BL is not connected to a power line and the string 50 is in the ON state, the voltage supplied to the bit line BL is lowered. Based on the difference, similarity between the search data and the stored data provided in the search target block is determined.

The memory cell transistor MT provided in the search target block is referred to as a "first memory cell" in some cases. In the search operation according to the embodiment, when data indicated by the (2k)-th and (2k+1)-th (where k is a natural number of 1 or more) first memory cells from the side of the source line SL among the plurality of memory cell transistors MT (the first memory cells) are the same as the search data in the search target block, at least any of the (2k)-th and (2k+1)-th first memory cells from the side of the source line SL is controlled to enter the OFF state. Conversely, when data indicated by the (2k)-th and (2k+1)-th first memory cells from the side of the source line SL among the plurality of first memory cells is different from the search data, the (2k)-th and (2k+1)-th first memory cells from the side of the source line SL are controlled to enter the ON state.

The string 50 provided in the search target block is referred to as a "first string" in some cases. The memory cell transistors MT provided in the first string are referred to as "first memory cells" in some cases. Here, it is said that the plurality of first memory cells are connected in series between the bit line BL and the source line SL.

In the foregoing representation, it can be said that predetermined voltage is supplied to the plurality of word lines respectively corresponding to the plurality of first memory cells provided in the search target block based on the search data in the search operation on the string 50 (the first string) provided in the search target block.

In the sense operation executed after the search operation, voltage of the bit line BL is changed by current flowing between the bit line BL and the source line SL belonging to the string 50 (the first string) provided in the search target block via the string 50. The change is determined by the search data and data (stored data) stored in the memory cell transistors MT (the first memory cells) provided in the search target block. Accordingly, similarity between the pieces of data can be determined based on the change in the voltage.

In the embodiment, as described above, the data (stored data) stored in the memory cell transistors MT provided in the search target block is data stored in the memory cell transistors MT corresponding to the adjacent word lines WL2$k$ and WL2$k$+1 among the plurality of memory cell transistors MT (the first memory cells) provided in the string 50 (the first string) in the block.

In the embodiment, the configuration in which the stored data and the search data are designated by adjacent two memory cell transistors MT has been exemplified, but the pieces of data may be designated by adjacent three or more memory cell transistors MT or may be designated by two or more memory cell transistors MT which are not adjacent.

As described above, the memory system 1 according to the embodiment can determine whether the stored data in the search target block is the same as the search data based on the change in the voltage supplied to the bit line BL in the sense operation. In the embodiment, the memory cell transistors MT are the depression type transistors. Accordingly, when the stored data is different from the search data, the string 50 is in the OFF state. Since the stored data is different from the search data in many cases in the search operation, the search operation of the memory system 1 can further reduce power consumption by the foregoing configuration.

1-9. Modified Examples

Modified examples of the first embodiment will be described with reference to FIGS. 13 and 14. In the embodiment illustrated in FIGS. 7 to 12, the memory cell transistors MT are the N-type transistors. Meanwhile, in modified examples illustrated in FIGS. 13 and 14, the memory cell transistors MT are P-type transistors.

Figure 13:
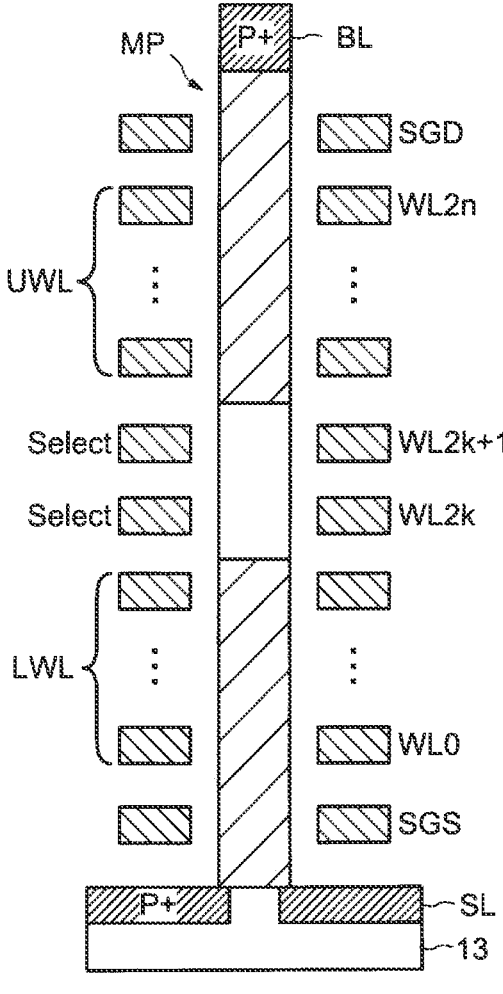
FIG. 13 is a diagram illustrating a configuration of the string according to the embodiment.

FIG. 13 is a diagram illustrating a configuration of the string according to the embodiment. The configuration illustrated in FIG. 13 is similar to the configuration illustrated in FIG. 7, but the configurations are different from each other in that resistance of semiconductors is lowered with an N-type dopant in FIG. 7, but resistance of semiconductors is lowered with a P-type dopant in FIG. 13. In FIG. 13, the semiconductors are indicated by "P+". As in FIG. 7, 0 V is supplied as source voltage to the semiconductor substrate 13. Bit voltage supplied to the bit line BL is voltage (for example, 0.5 V) higher than the source voltage.

When the memory cell transistor MT is the depression type and P-type transistor, as described above, the source voltage is 0 V and the bit voltage is 0.5 V in the read operation. When voltage supplied to the word line WL corresponding to the memory cell transistor MT selected as a read operation target is referred to as "first read voltage" and voltage supplied to the word line WL corresponding to the non-selected memory cell transistor MT which is not the read operation target is referred to as "second read voltage", 0 V is supplied as the second read voltage to the word line WL corresponding to the non-selected memory cell transistor MT and any voltage of 2 V to 9 V is supplied as the first read voltage to the word line WL corresponding to the selected memory cell transistor MT.

In the search operation and the sense operation, the non-selected memory cell transistor MT and the selected memory cell transistor MT are controlled as described above. That is, in the search operation and the sense operation, the second read voltage is supplied to the memory cell transistors MT corresponding to the word lines WL indicated by the foregoing UWL and LWL.

Figure 14:
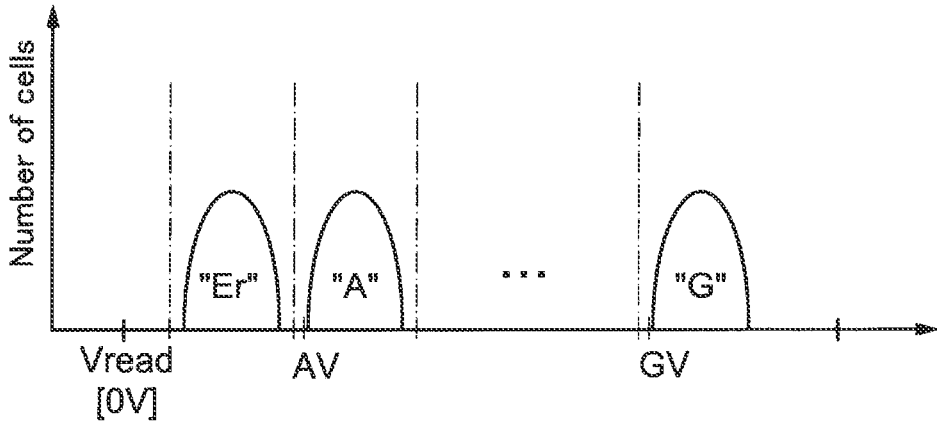
FIG. 14 is a diagram illustrating the threshold voltage distribution of the memory cell transistor according to the embodiment.

FIG. 14 is a diagram illustrating the threshold voltage distribution of the memory cell transistor according to the embodiment. As illustrated in FIG. 14, since the memory cell transistor MT according to the embodiment is the depression type and P-type transistor, the memory cell transistor MT has a write level in a voltage range greater than 0 V. The read voltage Vread in FIG. 14 is 0 V. Accordingly, among a plurality of write levels that can be taken by the memory cell transistor MT, the threshold voltage distribution ("Er" state) which is the lowest voltage can be said to be source voltage (0 V) or greater.

When the search operation and the sense operation are executed on the target memory cell transistor MT, voltage supplied to the word line WL connected to the memory cell transistor MT is 0 V or greater even when a write level of the memory cell transistor MT is any level of the "Er" state to the "G" state.

In the modified example, the bias voltage supplied to each word line WL provided in the string 50, the threshold voltage Vth of the memory cell transistor MT corresponding to each word line, and the ON/OFF state of the memory cell transistor MT are the same as those of FIG. 9. Similarly, in the modified example, a relation between the threshold voltages Vth (the write level) of the memory cell transistors MT corresponding to the word lines WL2$k$ and WL2$k$+1 in the search target block and the stored data corresponding to the threshold voltages Vth is the same as that of FIG. 10.

FIG. 15 is a diagram illustrating voltage supplied to a word line of the search target block in search target data in the search operation according to the embodiment. FIG. 15 is similar to FIG. 11, but the following points are different from FIG. 11.

As illustrated in FIG. 15, when the search data is "0", "H" is supplied to the word line WL2$k$ and 0 V is supplied to word line WL2$k$+1. When the search data is "1", 0 V is supplied to the word line WL2$k$ and "H" is supplied to the word line WL2$k$+1. When the search data is "X", "H" is supplied to the word lines WL2$k$ and WL2$k$+1. "H" is set to voltage between the write levels "Er" and "A".

Referring to FIGS. 10, 14, and 15, when the threshold voltages Vth of the memory cell transistors MT corresponding to the search target word lines WL2$k$ and WL2$k$+1 are respectively "Er" and "A" (corresponding to the stored data "0" of FIG. 10) and the search data is "0" or "X", the memory cell transistor MT corresponding to the word line WL2$k$ (Er) is controlled to enter the OFF state and the memory cell transistor MT corresponding to the word line WL2$k$+1 (A) is controlled to enter the ON state. Conversely, when the search data is "1", the memory cell transistor MT corresponding to the word line WL2$k$ (A) and the memory cell transistor MT corresponding to the word line WL2$k$+1 (Er) are both controlled to enter the ON state.

As described above, when the threshold voltages Vth of the memory cell transistors MT corresponding to the search target word lines WL2$k$ and WL2$k$+1 are respectively "A" and "Er" (corresponding to the stored data "1" of FIG. 10) and the search data is "0", the memory cell transistor MT corresponding to the word line WL2$k$ (A) and the memory cell transistor MT corresponding to the word line WL2$k$+1 (Er) are both controlled to enter the ON state. Conversely, when the search data is "1" or "X", the memory cell transistor MT corresponding to the word line WL2$k$ (Er) is controlled to enter the ON state and the memory cell transistor MT corresponding to the word line WL2$k$+1 (A) is controlled to enter the OFF state.

In the foregoing search operation, a conductive state between the bit line and the source line determined according to the data stored in the search target block and the search target data is the same as that of FIG. 12.

2. Second Embodiment

A memory system according to a second embodiment will be described with reference to FIGS. 16 to 19. Since a configuration of the memory system according to the second embodiment is similar to that of the memory system according to the first embodiment, description of common points will be omitted. Hereinafter, points different from those of the memory system according to the first embodiment will be mainly described.

2-1. Configuration of Memory Cell Array

FIG. 16 is a schematic diagram illustrating a configuration of a memory cell array of a semiconductor memory device according to the embodiment. The X, Y, and Z axes illustrated in FIG. 16 are the same as the X, Y, and Z axes illustrated in FIG. 4. As illustrated in FIG. 16, the plurality of bit lines BL extend in the X axis direction and are located in a row in the Y axis direction. The number of bit lines BL is 16 in the example of FIG. 16. The plurality of word lines WL extend in the Y axis direction, are located in a row in the X axis direction, and are stacked in the Z axis direction. The number of stacked word lines WL is 100 in the example of FIG. 16. Here, for easy description, only word lines WL of four layers of the word lines WL2$k$−1 to WL2$k$+2 among the plurality of word lines WL are illustrated in FIG. 16.

In a pattern of each word line WL, a plurality of strings 50 are provided. The plurality of strings 50 are connected to the plurality of bit lines BL, respectively. The strings 50 extend in the Z axis direction and are commonly provided in the plurality of word lines WL. The number of strings 50 provided in the pattern of one word line WL is the same as the number of bit lines. One block BLK is configured with the plurality of word lines WL stacked in the Z axis direction and the strings 50 surrounded by the plurality of word lines WL.

For example, blocks BLK0 to BLK3 sharing the bit line BL are search target blocks. Here, current flowing from each bit line BL to the source line SL differs depending on whether the stored data stored in the memory cell transistors MT corresponding to the word lines WL2$k$ and WL2$k$+1 of each of the blocks BLK0 to BLK3 is the same as the search data. As will be described below, a current amount is determined according to the similarity between the stored data and the search data. Therefore, the similarity between the stored data and the search data can be evaluated based on a change in voltage of the bit line BL caused by the current.

For example, the strings 50 provided in the search target blocks BLK1 and BLK2 are respectively referred to as a "first string" and a "second string" in some cases. The memory cell transistors MT provided in the first and second strings are respectively referred to as a "first memory cell" and a "second memory cell" in some cases. Here, it is said that the plurality of first memory cells and the plurality of second memory cells are connected in series between the bit line BL and the source line SL.

The word line WL provided in the block BLK1 is referred to as a "first word line" in some cases. The word line WL provided in the block BLK2 is referred to as a "second word line" in some cases. In a sense operation to be described below, the first and second word lines are individually controlled. The blocks BLK1 and BLK2 are controlled as in the foregoing first embodiment.

2-2. Sense Operation

Figures 17, 18, 19:
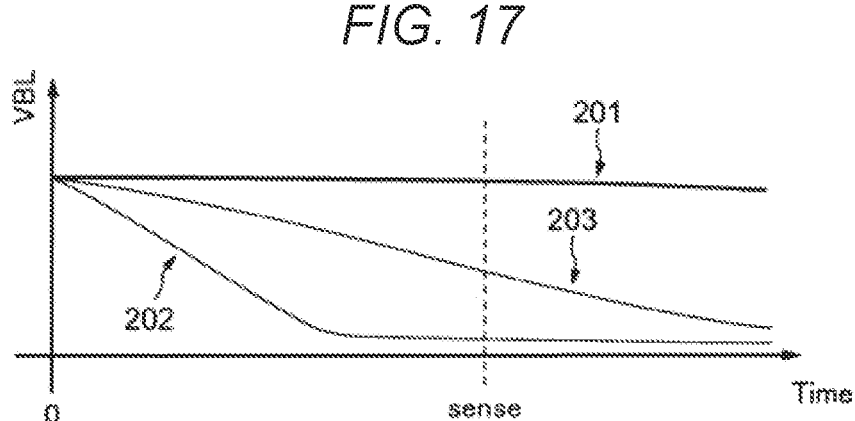
FIG. 17 is a diagram illustrating a sense operation based on a change in voltage of a bit line after a search operation in the memory cell array according to the embodiment.
FIG. 18 is a diagram illustrating an example of data stored in a search target block according to the embodiment.
FIG. 19 is a diagram illustrating a relationship between search data and ON/OFF state of the string according to the embodiment.

FIG. 17 is a diagram illustrating a sense operation based on a change in voltage of the bit line BL after the search operation in the memory cell array according to the embodiment. The horizontal axis of a graph illustrated in FIG. 17 represents time (Time) and the vertical axis represents bit line voltage (VBL). The graph illustrated in FIG. 17 shows a result when the search operation is executed with the plurality of blocks BLK set as search targets. The sense operation illustrated in FIG. 17 starts by supplying predetermined voltage to the bit lines BL from power lines in the blocks on which the search operation described in the first embodiment is executed and by disconnecting connection between the bit lines BL and the power lines to cause the bit lines BL to enter a floating state.

As illustrated in FIG. 12, when the stored data is the same as the search data, the strings 50 are in the OFF state. Therefore, voltage supplied to the bit lines BL in the sense operation is maintained as it is. Conversely, when the stored data is different from the search data, the strings 50 are in the ON state. Therefore, the voltage supplied to the bit lines BL is lowered. As illustrated in FIG. 16, the bit lines BL are provided commonly in the plurality of strings 50 provided in the plurality of blocks.

Accordingly, a change in the voltages of the bit lines BL differs depending on the number of strings 50 in the ON state among the plurality of strings 50 connected to the bit lines BL. Specifically, when the number of strings 50 in the ON state is large among the plurality of strings 50 connected to the bit lines BL, the voltages of the bit lines BL are sharply lowered. Conversely, when the number of strings 50 in the ON state is small among the plurality of strings 50 connected to the bit lines BL, the voltages of the bit lines BL are gently lowered.

That is, the voltage is gently lowered as the stored data and the search data in the search target block is similar. Accordingly, by measuring the voltages of the bit lines BL at a time point (sense) at which a predetermined time passed from the start of the sense operation, it is possible to determine the similarity between the stored data and the search data in the search target block.

In FIG. 17, a property 201 is a property when the stored data completely matches the search data in the search target block. When the stored data and the search data completely match each other, all the strings 50 connected to the bit lines BL are in the OFF state. Therefore, the voltage of the bit line BL is hardly changed even when the sense operation is started. Properties 202 and 203 are properties when the stored data does not match the search data in the search target block. Similarity between the stored data and the search data related to the property 202 is less than the similarity related to the property 203. That is, the number of strings 50 which are connected to the bit lines BL related to the property 202 and are in the ON state is greater than the number of strings 50 which are connected to the bit lines BL related to the property 203 and are in the ON state. Therefore, the voltages of the bit lines BL related to the properties 202 and 203 are all lowered as the sense operation is started. However, the voltages of the bit lines BL related to the property 202 are more sharply lowered than the voltages of the bit lines BL related to the property 203.

As described above, in the search operation, the voltage Vread (0 V) is supplied to the non-selected word lines WL, and 0 V or the bias voltage H (see FIG. 11) is supplied according to data searched in the search target word lines WL2$k$ and WL2$k$+1. After each voltage in the search operation is stabilized, the sense operation is executed. In the sense operation, high voltages are supplied to the bit lines BL, the bit lines BL are controlled to enter a floating state, and the voltages of the bit lines BL at a time point at which a predetermined time passed are measured. The search operation and the sense operation can be executed simultaneously on all the other blocks.

2-3. Similarity Determination

Similarity determination according to the embodiment will be described with reference to FIGS. 18 and 19. FIG. 18 is a diagram illustrating an example of data stored in the search target block according to the embodiment. The block BLK and the bit lines BL (BL0 to BL3) illustrated in FIG. 18 correspond to the block BLK and the bit lines BL illustrated in FIG. 16. Only the blocks BLK0 to BLK3 are illustrated in FIG. 16, but the blocks BLK0 to BLK7 are illustrated in FIG. 18. Sixteen bit lines BL are illustrated in FIG. 16, but only the bit lines BL0 to BL3 among the sixteen bit lines are illustrated in FIG. 18. In FIG. 18, all of the blocks BLK0 to BLK7 are the search target blocks.

FIG. 19 is a diagram illustrating a relationship between the search data and an ON/OFF state of the string according to the embodiment. As illustrated in FIG. 19, search data (Query) for the blocks BLK0 to BLK7 is "00010101".

As illustrated in FIG. 19, among the strings 50 belonging to the blocks BLK0 to BLK7 connected to the bit line BL0, the strings 50 belonging to the blocks BLK0, BLK1, BLK4, and BLK5 in which the same data as the search data is stored are in the OFF state. Conversely, the strings 50 belonging to the blocks BLK2, BLK3, BLK6, and BLK7 in which data different form the search data is stored are in the ON state.

Since the same data as the search data is stored in the blocks BLK0 to BLK7 connected to the bit line BL1, the strings 50 belonging to the blocks BLK0 to BLK7 are all in the OFF state.

Among the strings 50 belonging to the blocks BLK0 to BLK7 connected to the bit line BL2, the strings 50 belonging to the blocks BLK4 to BLK7 in which the same data as the search data is stored are in the OFF state. Conversely, the strings 50 belonging to the blocks BLK0 to BLK3 in which data different form the search data is stored are in the ON state.

Among the strings 50 belonging to the blocks BLK0 to BLK7 connected to the bit line BL3, the strings 50 belonging to the blocks BLK0, BLK2, and BLK4 in which the same data as the search data is stored are in the OFF state. Conversely, the strings 50 belonging to the blocks BLK1, BLK3, and BLK5 to BLK7 in which data different from the search data is stored are in the ON state.

As described above, since all the strings 50 connected to the bit line BL1 are in the OFF state, the voltage of the bit line BL1 is hardly changed in the sense operation like the property 201 of FIG. 17. Conversely, since some of the plurality of strings 50 connected to the bit lines BL0, BL2, and BL3 are in the ON state, the voltages of the bit lines BL are changed in the sense operation like the properties 202 and 203 of FIG. 17. In particular, since the number of strings 50 in the ON state among the strings 50 connected to the bit line BL3 is larger than the number of strings 50 in the ON state among the strings 50 connected to the bit lines BL0 and BL2, the voltage of the bit line BL3 indicates a behavior close to the property 202 of FIG. 17.

As described above, the memory system 1 according to the embodiment can determine the similarity between the stored data and the search data stored in the plurality of blocks BLK based on the change in the voltage supplied to the bit line BL commonly provided for the plurality of blocks BLK in addition to the advantages as those of the first embodiment. According to the method, it is possible to detect stored data similar to the search data even when the stored data does not completely match the search data.

3. Third Embodiment

A memory system according to a third embodiment will be described with reference to FIGS. 20 to 24. Since a configuration of the memory system according to the third embodiment is similar to that of the memory system according to the first embodiment, description of common points will be omitted. Hereinafter, points different from those of the memory system according to the first embodiment will be mainly described.

3-1. Configuration of String

Figure 20:
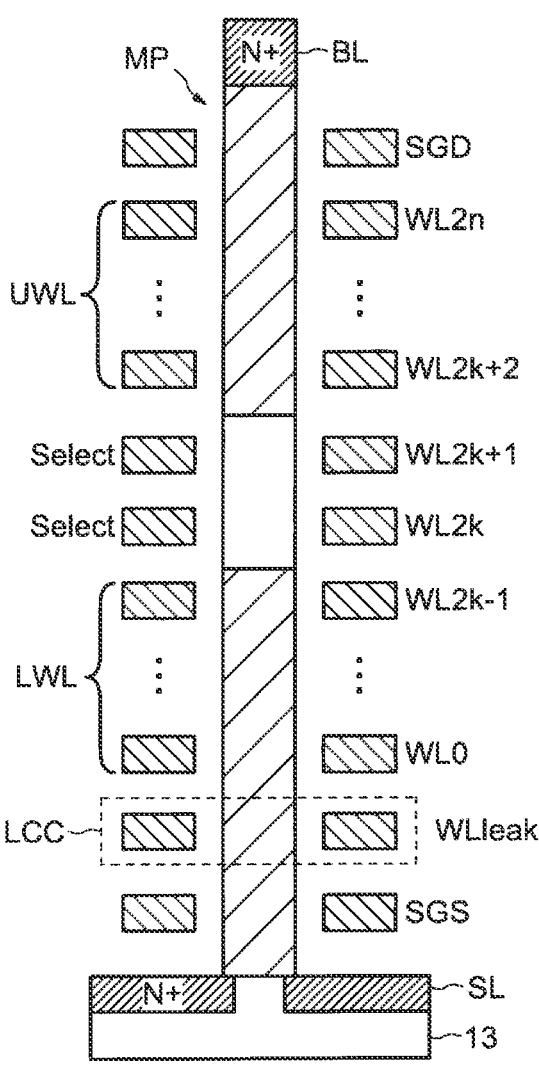
FIG. 20 is a diagram illustrating a configuration of a string according to an embodiment.

FIG. 20 is a diagram illustrating a configuration of the string according to the embodiment. A configuration of the string illustrated in FIG. 20 is similar to the configuration of the string illustrated in FIG. 7. The configuration illustrated in FIG. 20 is different from the configuration illustrated in FIG. 7 in that a current control word line WLleak is provided between the select gate line SGS and the word line WL0. The current control word line WLleak and the memory pillar MP configure the current control memory cell LCC.

As described above, when the string 50 provided in a search target block is referred to as a "first string" and the memory cell transistor MT provided in the first string is a "first memory cell", it can be said that the current control memory cell LCC is connected in series to the plurality of first memory cells between the bit line BL and the source line SL.

In the sense operation, the current control word line WLleak corresponding to the current control memory cell LCC is supplied with voltage less than the read voltage Vread and less than the threshold voltage Vth of the current control memory cell LCC (<the threshold voltage Vth of the current control memory cell LCC<the read voltage Vread).

The current control memory cell LCC has a configuration and an electric property similar to those of the memory cell transistor MT. The current control memory cell LCC controls current flowing in the string. By the control, it is possible to reduce a lowering speed of the voltage of the bit line BL in the sense operation illustrated in FIG. 17. As will be described in detail below, by reducing the lowering speed, it is possible to determine a difference in the similarity in the sense operation. Specifically, it is possible to determine the number of strings 50 in the ON state among the plurality of strings 50 connected to any bit line BL in FIG. 19.

3-2. Current Control Memory Cell

Figure 21:
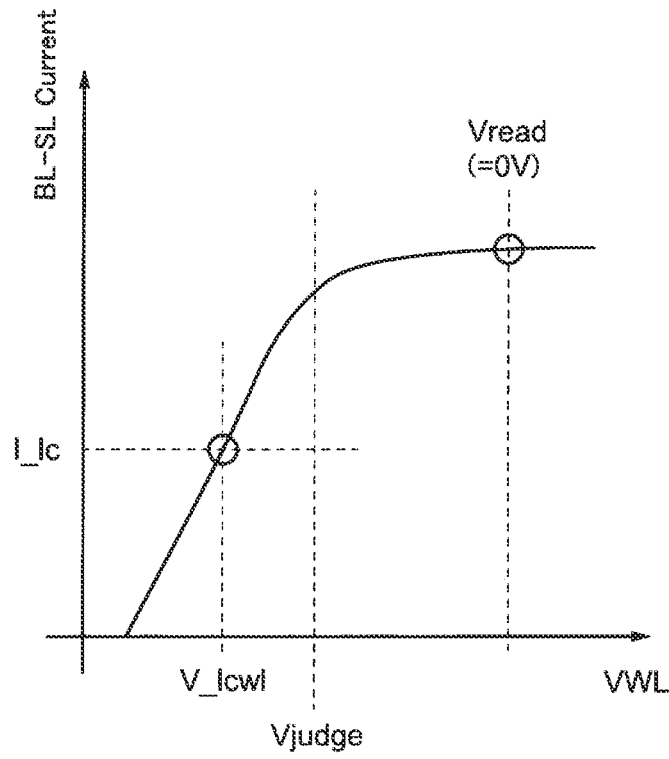
FIG. 21 is a diagram illustrating properties of a current control memory cell according to the embodiment.

FIG. 21 is a diagram illustrating properties of the current control memory cell according to the embodiment. An electric property illustrated in FIG. 21 is an electric property of the current control memory cell LCC and is an electric property similar to that of the memory cell transistor MT. The horizontal axis of FIG. 21 represents a word line voltage VWL supplied to the current control word line WLleak corresponding to the current control memory cell LCC. The vertical axis of FIG. 21 represents current flowing between the bit line BL and the source line SL (BL-SL Current). FIG. 21 is a semilogarithmic graph illustrating a BL-SL current value displayed in a logarithmic scale.

In FIG. 21, voltage (V_lcwl) is voltage supplied to current control word line WLleak in a sense operation. Threshold determination voltage Vjudge is voltage for determining a threshold voltage of the current control memory cell LCC and is any of the threshold determination voltages AR to GR illustrated in FIG. 6. The read voltage Vread is voltage for causing the current control memory cell LCC to enter an ON state regardless of data stored in the current control memory cell LCC. In the example illustrated in FIG. 21, the read voltage Vread is 0 V.

The voltage (V_lcwl) is voltage less than the read voltage Vread (0 V) and the threshold determination voltage Vjudge (AR to GR of FIG. 6). In other words, when the voltage (V_lcwl) is supplied to the word line WL of the current control memory cell LCC, current (I_lc) of a subthreshold region (or a linear region) flows in the current control memory cell LCC.

The current (I_lc) is less than the current flowing in the current control memory cell LCC when the read voltage Vread is supplied to the word line WL, and is less than the current flowing in the current control memory cell LCC when the threshold determination voltage Vjudge is supplied to the word line WL. Since the current control memory cell LCC is connected in series to the plurality of memory cell transistors MT between the bit line BL and the source line SL, current flowing in the string 50 is limited to the current (I_lc) corresponding to the voltage (V_lcwl).

Figure 22:
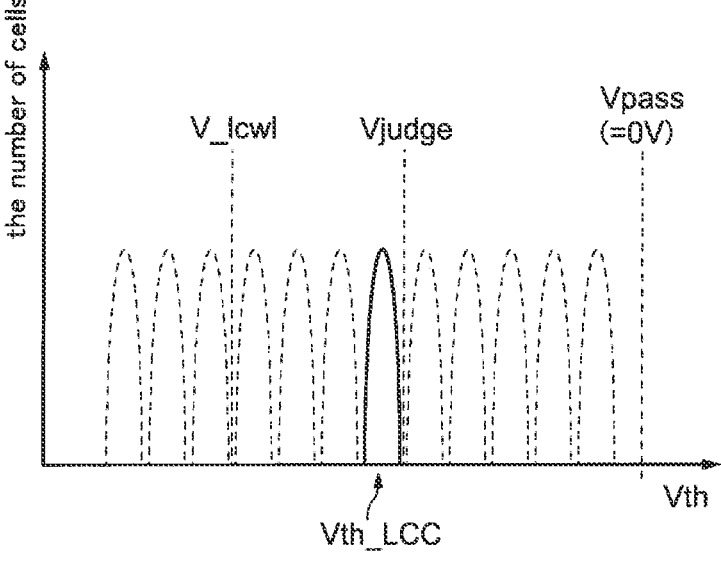
FIG. 22 is a diagram illustrating a threshold voltage distribution related to the current control memory cell according to the embodiment.

FIG. 22 is a diagram illustrating a threshold voltage distribution of the memory cell transistor according to the embodiment. In FIG. 22, threshold voltage Vth_LCC of the current control memory cell LCC is indicated by a solid line. The threshold determination voltage Vjudge is voltage higher than the upper end of the threshold voltage Vth_LCC. The voltage (V_lcwl) is voltage sufficiently lower than the lower end of the threshold voltage Vth_LCC.

In the foregoing configuration, even when the stored data stored in the search target block and the search data are different from each other, current flowing between the bit line BL and the source line SL via the string 50 is limited by the current (I_lc). Accordingly, the lowering of the voltage of the bit line BL in the sense operation illustrated in FIG. 17 becomes gentle.

A speed of the lowering of the voltage in the bit line BL depends on the current flowing in the current control memory cell LCC. When the voltage (V_lcwl) of FIG. 21 is fixed, a current amount flowing in the current control memory cell LCC is determined according to the threshold voltage Vth (the write levels A to G) of the current control memory cell LCC. Accordingly, by executing the write operation on the current control memory cell LCC before the sense operation and adjusting the threshold voltage Vth of the current control memory cell LCC, it is possible to adjust a behavior of the lowering of the voltage of the bit line BL. That is, after an electronic device on which the memory system 1 is mounted is shipped to a market, the threshold voltage Vth of the current control memory cell LCC is dynamically adjusted.

Conversely, when a current amount flowing in the current control memory cell LCC is determined in advance, the threshold voltage Vth of the current control memory cell LCC may be fixed. For example, before an electronic device on which the memory system 1 is mounted is shipped to a market, the threshold voltage Vth of the current control memory cell LCC is fixed. That is, the threshold voltage Vth of the current control memory cell LCC can be adjusted before the electronic device is distributed in the market. However, when the electronic device is distributed in the market and is passed to the hands of a user, the user cannot change the threshold voltage Vth of the current control memory cell LCC.

Figure 23:
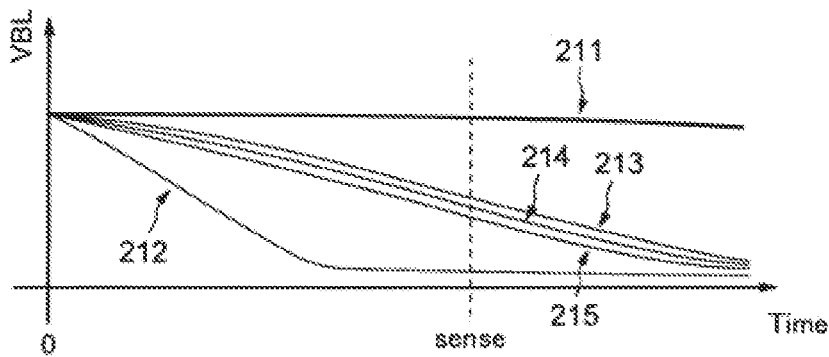
FIG. 23 is a diagram illustrating a change in voltage of a bit line after a search operation in the memory cell array according to the embodiment.
Figure 24:
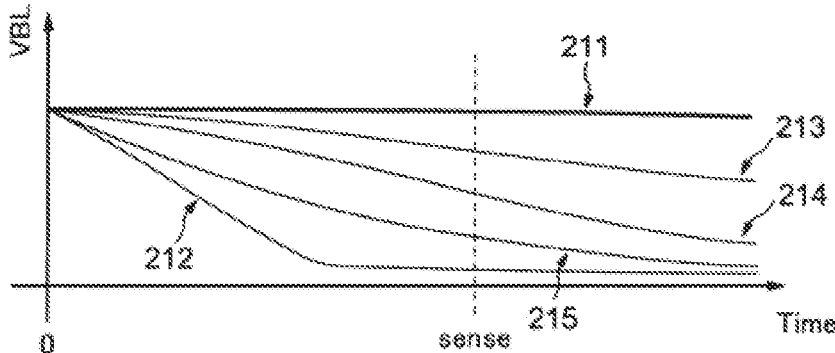
FIG. 24 is a diagram illustrating a change in voltage of the bit line after the search operation in the memory cell array according to the embodiment.

FIG. 23 illustrates an example in which a sense operation is executed in a configuration where the current control memory cell LCC is not provided (or a configuration where the read voltage Vread is supplied to the current control memory cell LCC in the configuration illustrated in FIG. 20). Meanwhile, FIG. 24 illustrates an example in which a sense operation similar to FIG. 23 is executed in the configuration where the voltage (V_lcwl) is supplied to the current control memory cell LCC in the configuration illustrated in FIG. 20. As in FIG. 17, FIGS. 23 and 24 are diagrams illustrating a change in voltage of the bit line BL after a search operation in the memory cell array according to the embodiment.

Properties 211 and 212 illustrated in FIG. 23 are similar to the properties 201 and 202 illustrated in FIG. 17. The properties 211 and 212 can be distinguished according to the sense operation even in a configuration where the current control memory cell LCC is not provided. On the other hand, according to properties 213 to 215 illustrated in FIG. 23, there is no considerable difference in voltage of the bit line BL at a time point (sense) at which a predetermined time passed from start of the sense operation. Accordingly, in a configuration where the current control memory cell LCC is not provided, it is difficult to distinguish the properties 213 to 215 according to the sense operation.

On the other hand, in the configuration where the current control memory cell LCC is provided as in the embodiment, as described above, current flowing between the bit line BL and the source line SL via the string 50 is limited to the current (I_lc) by the current control memory cell LCC. Accordingly, as illustrated in FIG. 24, the lowering of the voltage of the bit line BL in the sense operation becomes gentle with respect to the properties 213 to 215. As a result, as illustrated in FIG. 24, there is a difference in the voltage of the bit line BL in the properties 211 to 215 at the time point of sense. Accordingly, in the configuration according to the embodiment, it is possible to distinguish the properties 211 to 215 from each other.

As described above, the memory system 1 according to the embodiment can distinguish a plurality of similarities in addition to advantages similar to those of the first embodiment.

4. Fourth Embodiment

A memory system according to a fourth embodiment will be described with reference to FIGS. 25 to 27. Since a configuration of the memory system according to the fourth embodiment is similar to that of the memory system according to the third embodiment, description of common points will be omitted. Hereinafter, points different from those of the memory system according to the first and third embodiments will be mainly described.

4-1. Current Control Memory Cell

Figure 25:
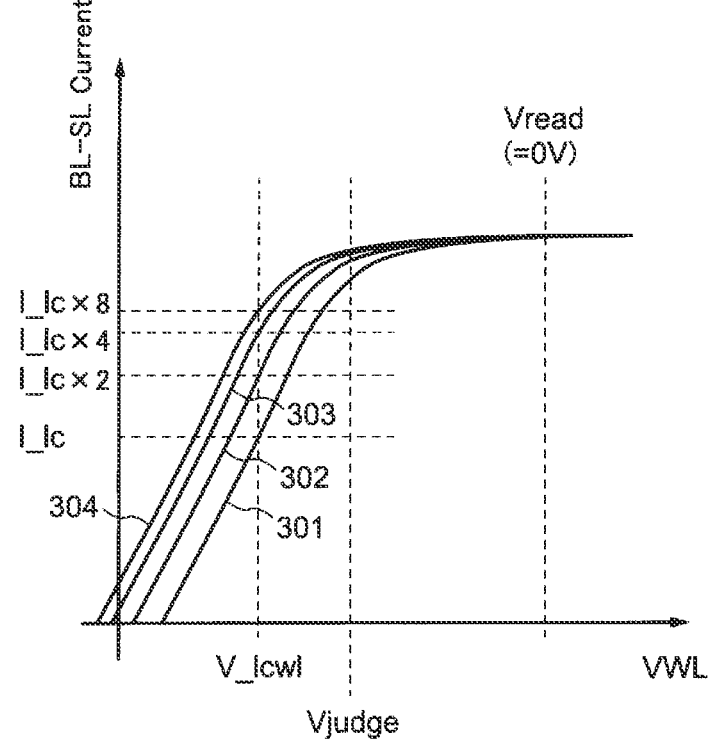
FIG. 25 is a diagram illustrating properties of the current control memory cell according to an embodiment.

FIG. 25 is a diagram illustrating properties of the current control memory cell according to the embodiment. FIG. 25 illustrates four electric properties (301 to 304). The electric properties 301 to 304 are electric properties of the current control memory cells LCC having different threshold voltages Vth. The current control memory cell LCC indicating the electric property 301 causes the current (I_lc) to flow with respect to the voltage (V_lcwl).

The current control memory cell LCC indicating the electric property 302 causes current (I_lc*2) to flow which is twice the current (I_lc) with respect to the voltage (V_lcwl). The current control memory cell LCC indicating the electric property 303 causes current (I_lc*4) to flow which is 4 times the current (I_lc) with respect to the voltage (V_lcwl). The current control memory cell LCC indicating the electric property 304 causes current (I_lc*8) to flow which is 8 times the current (I_lc) with respect to the voltage (V_lcwl).

Figure 26:
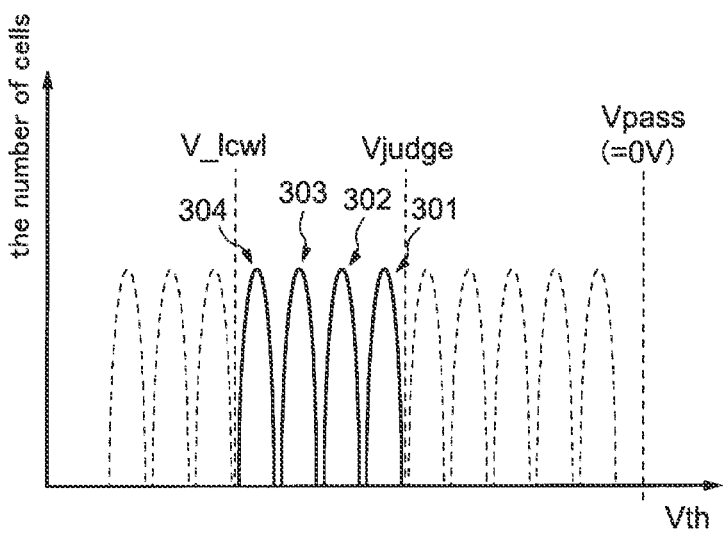
FIG. 26 is a diagram illustrating a threshold voltage distribution related to the current control memory cell according to the embodiment.

FIG. 26 is a diagram illustrating a threshold voltage distribution related to the memory cell transistor according to the embodiment. In FIG. 26, the threshold voltages Vth of the current control memory cells LCC corresponding to the electric properties 301 to 304 of FIG. 25 are indicated by solid lines. The threshold voltage Vth corresponding to the electric property 301 is the highest voltage among the voltages and the threshold voltage Vth corresponding to the electric property 304 is the lowest voltage among the voltages. As such, by controlling the threshold voltages Vth of the current control memory cells LCC, it is possible to control the current flowing in the string 50 to which the current control memory cells LCC belong.

In the embodiment, the configuration where the currents are one, two, four, eight times the voltage (V_lcwl) is exemplified, but embodiments are not limited thereto. The current values may differ to the degree that the electric properties can be distinguished from each other, the electric properties 302 to 304 may not be an integral multiple of the electric property 301.

4-2. Sense Operation and Similarity Determination

Figure 27:
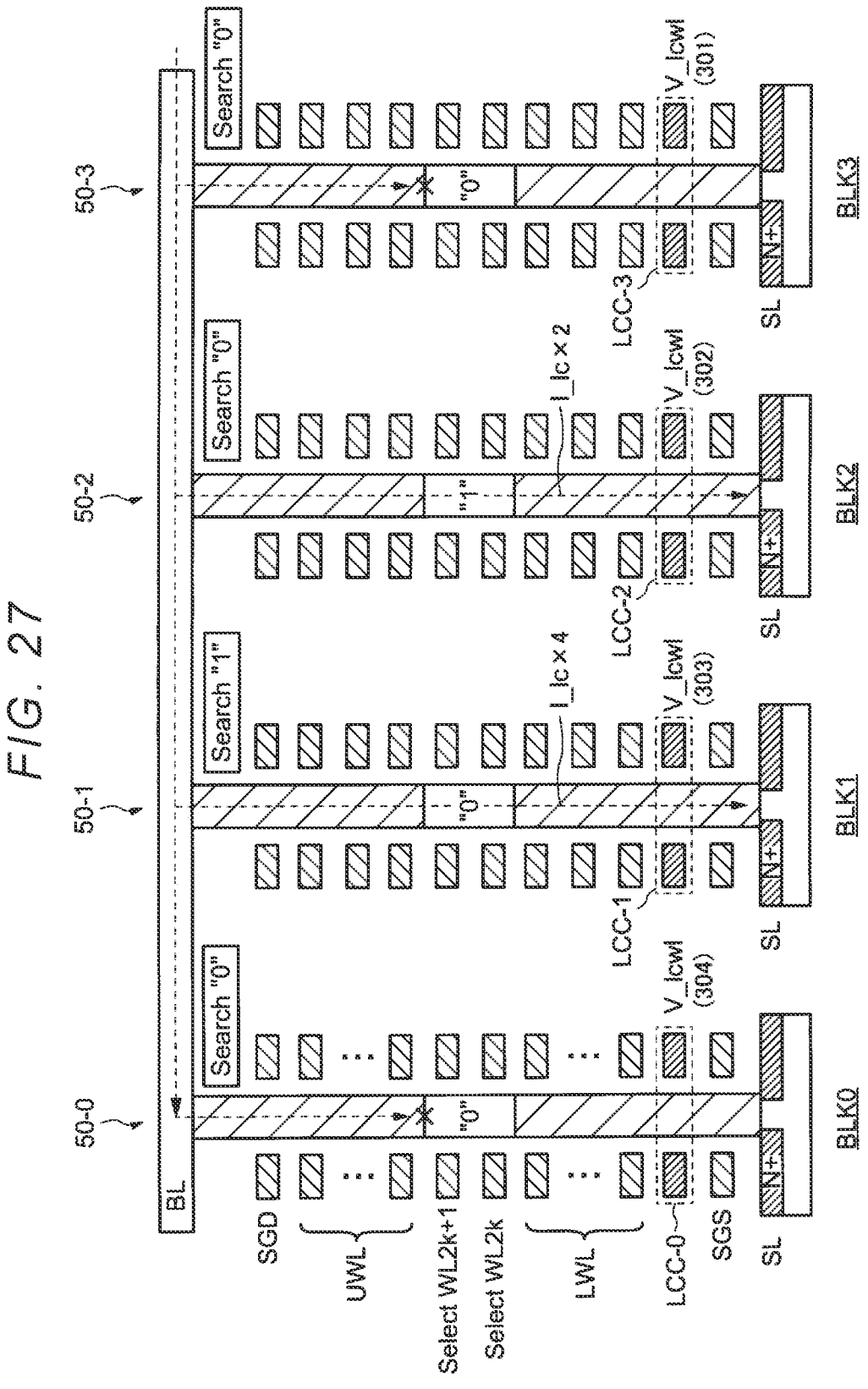
FIG. 27 is a diagram illustrating a sense operation and similarity determination in the memory cell array according to the embodiment.

FIG. 27 is a diagram illustrating the sense operation and similarity determination in the memory cell array according to the embodiment. FIG. 27 illustrates the strings 50 provided in the blocks BLK0 to BLK3. Strings 50-0 to 50-3 are strings corresponding to each of the blocks BLK0 to BLK3. Since configurations of the strings 50-0 to 50-3 are the same as the configuration illustrated in FIG. 20, description thereof will be omitted.

In FIG. 27, the current control memory cells LCC provided in each of the strings 50-0 to 50-3 have different threshold voltages Vth. Therefore, the memory cells have different electric properties. Specifically, a current control memory cell LCC-0 belonging to the string 50-0 has the electric property 304. A current control memory cell LCC-1 belonging to the string 50-1 has the electric property 303. A current control memory cell LCC-2 belonging to the string 50-2 has the electric property 302. A current control memory cell LCC-3 belonging to the string 50-3 has the electric property 301.

Accordingly, when the stored data is different from the search data in all the strings 50 and each string 50 is in the ON state, the current (I_lc*8) flowing in the string 50-0 is 8 times the current (I_lc) in the string 50-3. Similarly, the current (I_lc*4) flowing in the string 50-1 is 4 times the current flowing in the string 50-3, and the current (I_lc*2) flowing in the string 50-2 is twice the current flowing in the string 50-3.

In the strings 50-0 to 50-3, pieces of stored data "0", "0", "1", and "0" are stored in the memory cell transistors MT corresponding to the word lines WL$2k$ and WL$2k$+1. Meanwhile, the search data for the strings 50-0 to 50-3 are "0", "1", "0", and "0", respectively. For the strings 50-0 and 50-3, the stored data stored in the strings 50 matches the search data. Accordingly, the strings 50-0 and 50-3 are in the OFF state. On the other hand, for the strings 50-1 and 50-2, the stored data stored in the strings 50 do not match the search data. Accordingly, the strings 50-1 and 50-2 are in the ON state.

As described above, total current flowing from the bit line BL to the source line SL is a sum of the current (I_lc*4) flowing in the string 50-1 and the current (I_lc*2) flowing in the string 50-2. In the foregoing case, the total current flowing from the bit line BL to the source line SL is current (I_lc*6). In particular, in the embodiment, since the currents flowing in the strings 50-0 to 50-3 are respectively (I_lc), (I_lc*2), (I_lc*4), and (I_lc*8), total current differs depending on combinations of the strings 50 in the ON state. Accordingly, the strings 50 in the ON state can be specified based on the total current. That is, the number of pieces of stored data matching the search data can be evaluated based on the total current.

In other words, in the above configuration, when similarity searching of 4-bit data ("0000" to "1111" values in binary representation and "0" to "15" values in decimal representation) is executed for 4-bit data, similarity is calculated by assigning a weight of *8 to the upper first bit, assigning a weight of *4 to the second bit, assigning a weight of *2 to the third bit, and assigning a weight of *1 to the fourth bit.

The string 50-1 provided in the search target block BLK1 is referred to as a "first string" in some cases. The string 50-2 provided in the search target block BLK2 is referred to as a "second string" in some cases. The current control memory cell LCC-1 provided in the string 50-1 (the first string) is referred to as a "first current control memory cell" in some cases. The current control memory cell LCC-2 provided in the string 50-2 (the second string) is referred to as a "second current control memory cell" in some cases. The current (I_lc*4) flowing in the string 50-1 (the first string) by the first current control memory cell is referred to as "first current" in some cases. The current (I_lc*2) flowing in the string 50-2 (the second string) by the second current control memory cell is referred to as "second current" in some cases.

In the foregoing representation, in the sense operation, it can be said that the first current control memory cell is controlled such that the first current (I_lc*4) flows between the bit line BL and the source line SL via the first string. Similarly, in the sense operation, it can be said that the second current control memory cell is controlled such that the second current (I_lc*2) flows between the bit line BL and the source line SL via the second string. In other words, in the embodiment, the first current flows by controlling the threshold voltage Vth of the first current control memory cell to a first level (the level indicated by the electric property 303). Similarly, the second current flows by controlling the threshold voltage Vth of the second current control memory cell to a second level (the level indicated by the electric property 302).

For example, a case where, for any data, upper bits are used to specify a broad category and lower bits are used to specify a subcategory of the broad category will be described. Here, the threshold voltage Vth of the current control memory cell LCC provided in each string 50 is controlled such that the current (I_lc*8) flows in the string 50 corresponding to the upper bit and the current (I_lc) flows in the string 50 corresponding to the lower bit. By such control, it is possible to determine similarity based on magnitude of the total current.

Specifically, when the total current is relatively small, the data of the lower bits are different and the data of the upper bits are the same, and similarity between the stored data and the search data can be determined to be relatively high (similar). Conversely, when the total current is relatively large, the data of the lower bits are the same and the data of the upper bits are different. Therefore, the similarity between the stored data and the search data can be determined to be relatively low (dissimilar).

Here, the memory cell transistor MT and the current control memory cell LCC-0 provided in the string 50-0 corresponding to the upper bits are referred to as a "first memory cell" and a "first current control memory cell" in some cases. The memory cell transistor MT and the current control memory cell LCC-3 provided in the string 50-3 corresponding to the lower bits are referred to as a "second memory cell" and a "second current control memory cell" in some cases. Respective currents flowing in the strings 50-0 and 50-3 when the stored data is different from the search data are referred to as "first current" and "second current" in some cases.

In the foregoing representation, it can be said that the first and second current control memory cells are controlled such that the first and second currents increase. Specifically, the threshold voltage Vth of the first current control memory cell is controlled to the threshold voltage Vth corresponding to the electric property 304 of FIG. 26 and the threshold voltage Vth of the second current control memory cell is controlled to the threshold voltage Vth corresponding to the electric property 301 of FIG. 26 such that the first current is greater than the second current.

As described above, the memory system 1 according to the embodiment can determine the similarity based on the current flowing between the bit line BL and the source line SL in addition to advantages similar to those of the first to third embodiments.

4-3. Modified Example

Modified example of the fourth embodiment will be described with reference to FIGS. 28 and 29. In the example illustrated in FIGS. 25 and 26, the current flowing in the current control memory cell LCC (that is, the current flowing in the string 50 to which the current control memory cell LCC belongs) is controlled according to the threshold voltage Vth of the current control memory cell LCC. Meanwhile, in the modified example illustrated in FIGS. 28 and 29, the current flowing in the current control memory cell LCC is controlled by controlling the voltage supplied to the current control word line WLleak corresponding to the current control memory cell LCC.

Figure 28:
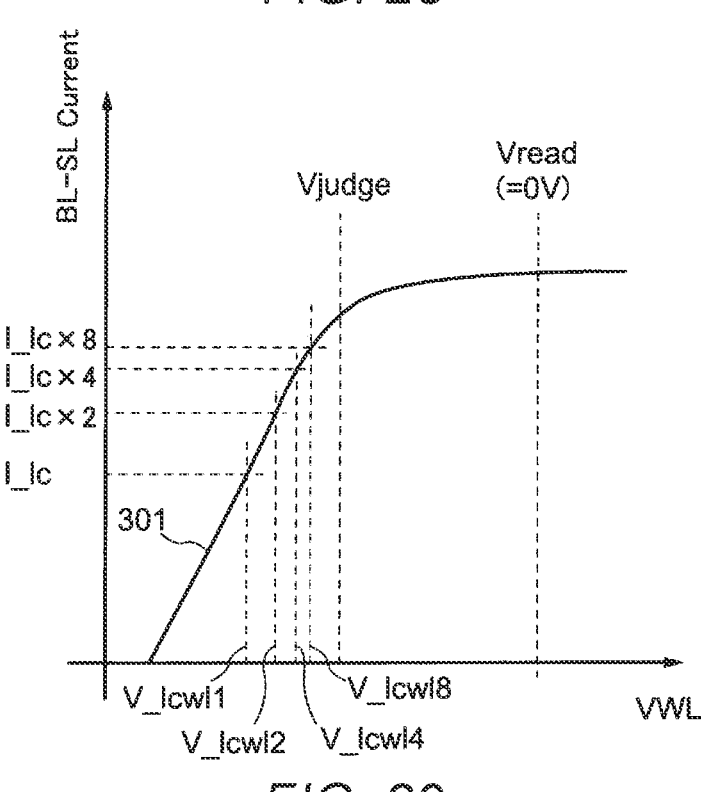
FIG. 28 is a diagram illustrating properties of a current control memory cell according to an embodiment.

FIG. 28 is a diagram illustrating properties of the current control memory cell according to the embodiment. In FIG. 28, voltages (V_lcwl1), (V_lcwl2), (V_lcwl4), and (V_lcwl8) are illustrated as the word line voltages VWL supplied to the word lines WL corresponding to the current control memory cells LCC. By supplying the voltages (V_lcwl1), (V_lcwl2), (V_lcwl4), and (V_lcwl8) to the current control memory cells LCC, the currents (I_lc), (I_lc*2), (I_lc*4), and (I_lc*8) flow in the current control memory cells LCC, respectively.

Figure 29:
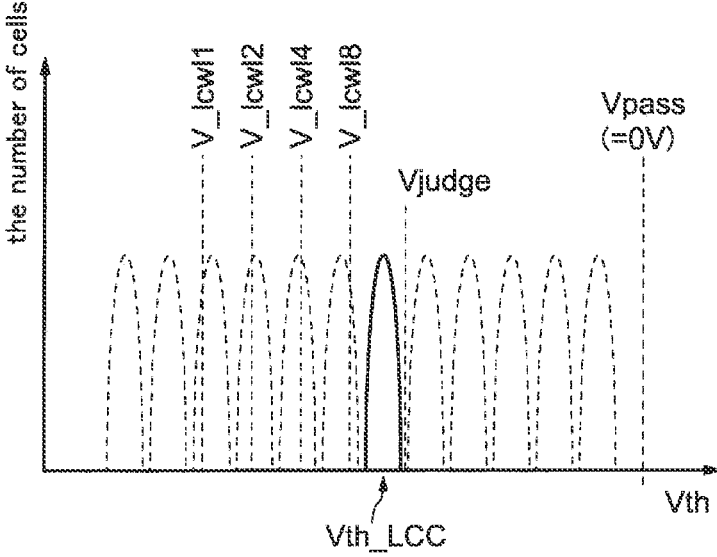
FIG. 29 is a diagram illustrating a threshold voltage distribution related to the current control memory cell according to the embodiment.

FIG. 29 is a diagram illustrating a threshold voltage distribution related to the memory cell transistor according to the embodiment. In FIG. 29, the threshold voltage Vth_LCC of the current control memory cell LCC is indicated by a solid line and the other threshold voltages Vth are indicated by dotted lines. Similarly, the voltages (V_lcwl1), (V_lcwl2), (V_lcwl4), and (V_lcwl8) are indicated by dotted lines. The voltage (V_lcwl1) is the lowest voltage among the voltages and the voltage (V_lcwl8) is the highest voltage among the voltages.

FIG. 29 illustrates the configuration in which the voltages (V_lcwl1), (V_lcwl2), (V_lcwl4), and (V_lcwl8) are corresponded to different threshold voltages Vth (write levels), but embodiments are not limited thereto. The voltages only needs be set such that the current control memory cells LCC causes the currents (I_lc), (I_lc*2), (I_lc*4), and (I_lc*8) to flow, and the voltages may not always be corresponded to the different voltages Vth.

As described in the foregoing modified example, by controlling the voltages supplied to the current control word line WLleak even when the threshold voltages Vth of the current control memory cells LCC are the same, it is possible to control the currents flowing in the current control memory cells LCC.

5. Fifth Embodiment

A memory system according to a fifth embodiment will be described with reference to FIGS. 30 and 31. Since a configuration of the memory system according to the fifth embodiment is similar to that of the memory system according to the first and fourth embodiment, description of common points will be omitted. Hereinafter, points different from those of the memory system according to the first and fourth embodiments will be mainly described.

5-1. Configuration of String

Figure 30:
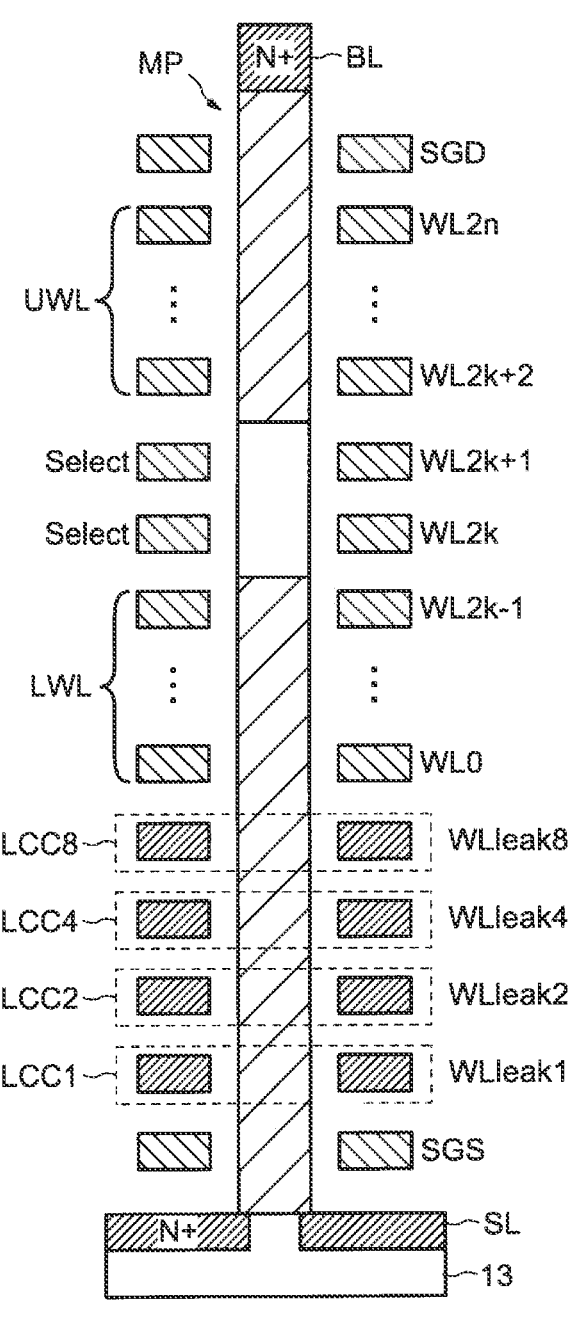
FIG. 30 is a diagram illustrating a configuration of a string according to an embodiment.

FIG. 30 is a diagram illustrating a configuration of a string according to the embodiment. The configuration of the string illustrated in FIG. 30 is similar to the configuration of the string illustrated in FIG. 20. The configuration illustrated in FIG. 30 is different from the configuration illustrated in FIG. 20 in that a plurality of current control word lines WLleak are provided between the select gate line SGS and the word line WL0. The plurality of current control word lines WLleak and memory pillars MP configure the plurality of current control memory cells LCC (LCC1, LCC2, LCC4, and LCC8).

As described above, when the string 50 provided in the search target block is referred to as a "first string" and the memory cell transistor MT provided in the first string is referred to as a "first memory cell", it can be said that the current control memory cell LCC is connected in series to the plurality of first memory cells between the bit line BL and the source line SL.

As illustrated in FIG. 30, current control word lines WLleak1, WLleak2, WLleak4, and WLleak8 are provided from the side of the select gate line SGS. The current control memory cells LCC1, LCC2, LCC4, and LCC8 corresponding to the current control word lines WLleak have different threshold voltages Vth (write levels).

The current control memory cell LCC1 corresponding to the current control word line WLleak1 indicates the electric property 301 of FIG. 25 and causes the current (I_lc) to flow based on the voltage (V_lcwl). The current control memory cell LCC2 corresponding to the current control word line WLleak2 indicates the electric property 302 of FIG. 25 and causes the current (I_lc*2) to flow based on the voltage (V_lcwl). The current control memory cell LCC4 corresponding to the current control word line WLleak4 indicates the electric property 303 of FIG. 25 and causes the current (I_lc*4) to flow based on the voltage (V_lcwl). The current control memory cell LCC8 corresponding to the current control word line WLleak8 indicates the electric property 304 of FIG. 25 and causes the current (I_lc*8) to flow based on the voltage (V_lcwl).

5-2. Sense Operation and Similarity Determination

Figure 31:
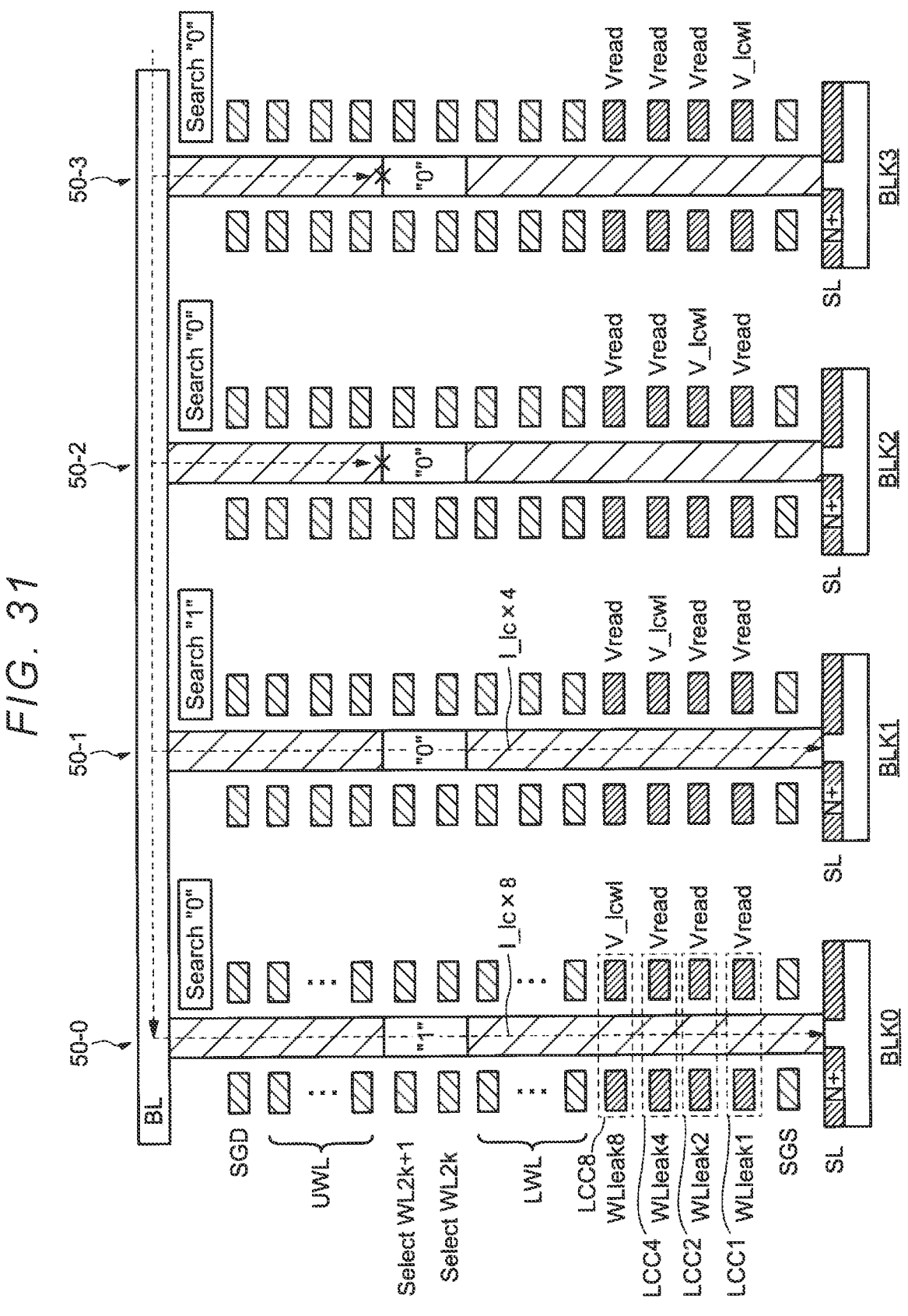
FIG. 31 is a diagram illustrating a sense operation and similarity determination in the memory cell array according to the embodiment.

FIG. 31 is a diagram illustrating the sense operation and similarity determination in the memory cell array according to the embodiment. A configuration illustrated in FIG. 31 is similar to the configuration illustrated in FIG. 27, and is different from the configuration illustrated in FIG. 27 in that the current control word lines WLleak1, WLleak2, WLleak4, and WLleak8 and the current control memory cells LCC1, LCC2, LCC4, and LCC8 corresponding thereto are provided. In the following description, description of a configuration similar to FIG. 27 will be omitted and a configuration different from FIG. 27 will be mainly described.

As illustrated in FIG. 31, the voltage (V_lcwl) similar to that of FIG. 25 is supplied to one current control word line WLleak among the plurality of current control word lines WLleak in each string 50. The read voltage Vread for controlling the current control memory cells LCC to enter the ON state is supplied to other current control word lines WLleak. The current control word line WLleak to which the voltage (V_lcwl) is supplied is different depending on the string 50.

Specifically, the voltage (V_lcwl) is supplied to the current control word line WLleak8 provided in the string 50-0. The voltage (V_lcwl) is supplied to the current control word line WLleak4 provided in the string 50-1. The voltage (V_lcwl) is supplied to the current control word line WLleak2 provided in the string 50-2. The voltage (V_lcwl) is supplied to the current control word line WLleak1 provided in the string 50-3.

In the sense operation, the voltage (V_lcwl) less than the read voltage Vread and less than the threshold voltage Vth of the current control memory cell LCC is supplied to one word line WLleak (for example, the current control word line WLleak8 in the string 50-0) among the plurality of current control word lines WLleak corresponding to the plurality of current control memory cells LCC. Meanwhile, the read voltage Vread is supplied to the other word lines WLleak (for example, the current control word lines WLleak1, WLleak2, and WLleak4 in the string 50-0) among the plurality of current control word lines WLleak.

Through the foregoing control, the current flowing in the string 50-0 is limited by the current control memory cell LCC8 corresponding to the current control word line WLleak8. As a result, when the stored data stored in the string 50-0 is different from the search data, the current (I_lc*8) flows in the string 50-0. Similarly, the current (I_lc*4) flows in the string 50-1.

The string 50-0 provided in the search target block BLK0 is referred to as a "first string" in some cases. The string 50-1 provided in the search target block BLK1 is referred to as a "second string" in some cases. The current control memory cell LCC provided in the string 50-0 (the first string) is referred to as a "first current control memory cell" in some cases. The word line corresponding to the first current control memory cell is referred to as a "first current control word line" in some cases. The current control memory cell LCC provided in the string 50-1 (the second string) is referred to as a "second current control memory cell" in some cases. The word line corresponding to the second current control memory cell is referred to as a "second current control word line" in some cases. The current (I_lc*8) flowing in the string 50-0 (the first string) by the first current control memory cell is referred to as "first current" in some cases. The current (I_lc*4) flowing in the string 50-1 (the second string) by the second current control memory cell is referred to as "second current" in some cases.

It can be said that the string 50-0 (the first string) includes the plurality of first current control memory cells. It can be said that the plurality of first current control memory cells are connected in series to the plurality of memory cell transistors MT (the first memory cells) between the bit line BL and the source line SL. Similarly, it can be said that the string 50-1 (the second string) includes the plurality of second current control memory cells. It can be said that the plurality of second current control memory cells are connected in series to the plurality of memory cell transistors MT (the second memory cells) between the bit line BL and the source line SL.

The plurality of first current control memory cells have different threshold voltages Vth, as illustrated in FIG. 26. Similarly, the plurality of second current control memory cells have different threshold voltages Vth.

In the foregoing representation, in the sense operation, it can be said that one first current control memory cell among the plurality of first current control memory cells is selected such that the first current (I_lc*8) flows between the bit line BL and the source line SL via the string 50-0 (the first string).

Similarly, in the sense operation, it can be said that one second current control memory cell among the plurality of second current control memory cells is selected such that the second current (I_lc*4) flows between the bit line BL and the source line SL via the string 50-1 (the second string).

When the stored data is different from the search data in all the strings 50, each string 50 is in the ON state. Here, the current flowing in the string 50-0 is controlled by the current control memory cell LCC8. As a result, the current (I_lc*8) flows in the string 50-0. Similarly, the current flowing in the string 50-1 is controlled by the current control memory cell LCC4. As a result, the current (I_lc*4) flows in the string 50-1. The current flowing in the string 50-2 is controlled by the current control memory cell LCC2. As a result, the current (I_lc*2) flows in the string 50-2. The current flowing in the string 50-3 is controlled by the current control memory cell LCC1. As a result, the current (I_lc) flows in the string 50-3.

In the embodiment, the currents flowing in the strings 50 can be changed by switching control voltages supplied to the current control word lines WLleak1, WLleak2, WLleak4, and WLleak8.

For example, in the string 50-0, by switching the voltage supplied to the current control word line WLleak1 from the read voltage Vread to the voltage (V_lcwl) and switching the voltage supplied to the current control word line WLleak8 from the voltage (V_lcwl) to the read voltage Vread, it is possible to change the current flowing in the string 50-0 from the current (I_lc*8) to the current (I_lc).

Similarly, in the string 50-3, by switching the voltage supplied to the current control word line WLleak8 from the read voltage Vread to the voltage (V_lcwl) and switching the voltage supplied to the current control word line WLleak1 from the voltage (V_lcwl) to the read voltage Vread, it is possible to change the current flowing in the string 50-3 from the current (I_lc) to the current (I_lc*8).

In the strings 50-0 to 50-3, the pieces of stored data "1", "0", "0", and "0" are stored in the memory cell transistors MT corresponding to the word lines WL2$k$ and WL2$k$+1. Meanwhile, the search data for the strings 50-0 to 50-3 are "0", "1", "0", and "0", respectively. For the strings 50-2 and 50-3, the stored data stored in the strings 50 match the search data. Accordingly, the strings 50-2 and 50-3 are in the OFF state. On the other hand, the stored data stored in the strings 50-0 and 50-1 do not match the search data. Accordingly, the strings 50-0 and 50-1 are in the ON state.

As described above, total current flowing from the bit line BL to the source line SL is a sum of the current (I_lc*8) flowing in the string 50-0 and the current (I_lc*4) flowing in the string 50-1. In the foregoing case, the total current flowing from the bit line BL to the source line SL is current (I_lc*12).

For example, a case where, for any data, upper bits are used to specify a broad category and lower bits are used to specify a subcategory of the broad category and a case where the strings 50-0, 50-1, 50-2, and 50-3 are associated in this order from the upper bit to the lower bit will be described. Here, the fact that the search data and the stored data stored in the strings 50-0 and 50-1 do not match each other means that the broad categories are different. Here, a relationship in which the stored data is considerably different from the search data as the total current (I_lc*12) is larger, as described above, is established in many cases.

Meanwhile, when the strings 50-2, 50-3, 50-0, and 50-1 are associated in this order from the upper bit to the lower bit and the stored data stored in the strings 50-0 and 50-1 do not match the search data, it means that the subcategories of the stored data and the search data are different. That is, a difference between the stored data and the search data is likely to be not large. Here, the foregoing relationship is not established.

According to the configuration of the embodiment, even here, the control voltages supplied to the current control word lines WLleak can be switched according to a relationship between the upper bit and the lower bit. For example, the voltage (V_lcwl) is supplied to the current control word line WLleak8 provided in the string 50-2 corresponding to the upper bit, and the read voltage Vread is supplied to the other current control word lines WLleak1, WLleak2, and WLleak4. The voltage (V_lcwl) is supplied to the current control word line WLleak1 provided in the string 50-1 corresponding to the lower bit, and the read voltage Vread is supplied to the other current control word lines WLleak2, WLleak4, and WLleak8. The voltage (V_lcwl) is supplied to the current control word line WLleak2 provided in the string 50-0 corresponding to the lower bit, and the read voltage Vread is supplied to the other current control word lines WLleak1, WLleak4, and WLleak8. By performing the control as such, the total current is (I_lc*3) and a relationship in which the difference between the stored data and the search data is small can be obtained.

In the foregoing case, the string 50-3 is referred to as a "first string", the memory cell transistor MT provided in the string 50-3 is referred to as a "first memory cell", the string 50-0 is referred to as a "second string", and the memory cell transistor MT provided in the string 50-0 is referred to as a "second memory cell". The current control memory cell LCC provided in the string 50-3 (the first string) is referred to as a "first current control memory cell", and the current control memory cell LCC provided in the string 50-0 (the second string) is referred to as a "second current control memory cell". Current flowing in the string 50-3 (the first string) by the first current control memory cell is referred to as "first current", and current flowing in the string 50-0 (the second string) by the second current control memory cell is referred to as "second current".

Here, the upper bits of certain data are configured with at least some of the plurality of first memory cells, and the lower bits of the certain data can be configured with at least some of the plurality of second memory cells. Here, in the sense operation, one current control word line WLleak is selected from the plurality of current control word lines WLleak corresponding to the plurality of first current control memory cells and one current control word line WLleak is selected from the plurality of current control word lines WLleak corresponding to the plurality of second current control memory cells, such that the first current flowing in the string 50-3 (the first string) is greater than the second current flowing in the string 50-0 (the second string).

As described above, in the memory system 1 according to the embodiment, it is possible to indicate magnitude of a difference between the stored data and the search data according to the magnitude of the total current between the bit line BL and the source line SL regardless of a position at which the upper bits of certain data are stored, in addition to advantages similar to those of the first to fourth embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

Even in other operational effects different from the operational effects obtained according to the aspects of the above-described embodiments, operational effects apparent from description of the present disclosure or predicted easily by those skilled in the art are, of course, construed to be obtained according to the embodiments.

What is claimed is:

1. A memory device comprising:

a bit line;

a source line;

a first string in which a plurality of first memory cells are connected in series between the bit line and the source line; and a control circuit configured to perform different operations on the first string, including a read operation on a selected first memory cell to determine a value of data stored in the selected first memory cell, and a sense operation for a search operation to determine if search data is stored in the plurality of first memory cells, wherein the control circuit, in the sense operation, supplies voltages to a plurality of word lines respectively corresponding to the plurality of first memory cells based on the search data, and determines a similarity between the search data and data actually stored in the plurality of first memory cells based on a change in voltage of the bit line caused by current flowing between the bit line and the source line via the first string, and the control circuit, in the read operation, supplies a source voltage to the source line, supplies a first read voltage to a word line corresponding to the selected first memory cell, and supplies a second read voltage to word lines corresponding to the first memory cells other than the selected first memory cell, wherein a difference between the second read voltage and the source voltage is less than a difference between the first read voltage and the source voltage.

2. The memory device according to claim 1, wherein the control circuit determines a similarity between the search data and the data actually stored in two or more adjacent memory cells among the plurality of first memory cells by supplying voltages to two or more word lines corresponding to the two or more adjacent first memory cells based on the search data.

3. The memory device according to claim 1, wherein the control circuit, in the sense operation, executes control such that one of at least (2k)-th and (2k+1)-th (where k is a natural number of 1 or more) first memory cells from a side of the source line among the plurality of first memory cells enters an OFF state when data actually stored in (2k)-th and (2k+1)-th first memory cells are the same as the search data, and executes control such that both the (2k)-th and (2k+1)-th first memory cells from the side of the source line among the plurality of first memory cells enter an ON state when the data actually stored in (2k)-th and (2k+1)-th first memory cells are different from the search data.

4. The memory device according to claim 1, wherein the first string includes a current control memory cell connected in series to the plurality of first memory cells between the bit line and the source line, and in the sense operation, the control circuit supplies a voltage less than a threshold voltage of the current control memory cell to the word line corresponding to the current control memory cell.

5. The memory device according to claim 1, further comprising:

a second string in which a plurality of second memory cells are connected in series between the bit line and the source line, wherein the first string includes a plurality of first word lines respectively controlling the plurality of first memory cells, the second string includes a plurality of second word lines respectively controlling the plurality of second memory cells, and the control circuit, in the sense operation, individually controls the first and second word lines, supplies voltages to the plurality of second word lines respectively corresponding to the plurality of second memory cells based on the search data, and determines a similarity between the search data and the data actually stored in the plurality of first memory cells and the plurality of second memory cells based on a change in voltage of the bit line caused by current flowing between the bit line and the source line via the first and second strings.

6. The memory device according to claim 5, wherein the first string includes a first current control memory cell connected in series to the plurality of first memory cells between the bit line and the source line, the second string includes a second current control memory cell connected in series to the plurality of second memory cells between the bit line and the source line, and in the sense operation, the control circuit controls the first current control memory cell such that first current flows between the bit line and the source line via the first string, and controls the second current control memory cell such that second current with an amount different from the first current flows between the bit line and the source line via the second string.

7. The memory device according to claim 6, wherein a threshold voltage of the first current control memory cell is different from a threshold voltage of the second current control memory cell.

8. The memory device according to claim 5, wherein the first string includes a plurality of first current control memory cells connected in series to the plurality of first memory cells between the bit line and the source line, the second string includes a plurality of second current control memory cells connected in series to the plurality of second memory cells between the bit line and the source line, the plurality of first current control memory cells have different threshold voltages, the plurality of second current control memory cells have different threshold voltages, and in the sense operation, the control circuit selects one first current control memory cell among the plurality of first current control memory cells such that first current flows between the bit line and the source line via the first string, and selects one second current control memory cell among the plurality of second current control memory cells such that second current with an amount different from the first current flows between the bit line and the source line via the second string.

9. The memory device according to claim 1, wherein the first string includes a plurality of current control memory cells connected in series to the plurality of first memory cells between the bit line and the source line, and threshold voltages of the plurality of current control memory cells are different from each other.

10. The memory device according to claim 9, wherein, in the sense operation, the control circuit supplies one word line among the plurality of word lines corresponding to the plurality of current control memory cells with voltage less than a threshold voltage of the current control memory cell corresponding to the one word line, and supplies other word lines among the plurality of word lines corresponding to the plurality of current control memory cells with voltages by which the plurality of current control memory cells are controlled to an ON state regardless of data stored therein.

11. A method of operating a memory device comprising a bit line, a source line, a first string in which a plurality of first memory cells are connected in series between the bit line and the source line, and a control circuit configured to perform different operations on the first string, including a read operation on a selected first memory cell to determine a value of data stored in the selected first memory cell, and a sense operation for a search operation to determine if search data is stored in the plurality of first memory cells, wherein the sense operation includes the steps of:

supplying voltages to a plurality of word lines respectively corresponding to the plurality of first memory cells based on the search data, and determining a similarity between the search data and data actually stored in the plurality of first memory cells based on a change in voltage of the bit line caused by current flowing between the bit line and the source line via the first string, and the read operation includes the steps of:

supplying a source voltage to the source line, supplying a first read voltage to a word line corresponding to the selected first memory cell, and supplying a second read voltage to word lines corresponding to the first memory cells other than the selected first memory cell, wherein a difference between the second read voltage and the source voltage is less than a difference between the first read voltage and the source voltage.

12. The method according to claim 11, wherein the control circuit determines a similarity between the search data and the data actually stored in two or more adjacent memory cells among the plurality of first memory cells by supplying voltages to two or more word lines corresponding to the two or more adjacent first memory cells based on the search data.

13. The method according to claim 11, wherein the control circuit, in the sense operation, executes control such that one of at least (2k)-th and (2k+1)-th (where k is a natural number of 1 or more) first memory cells from a side of the source line among the plurality of first memory cells enters an OFF state when data actually stored in (2k)-th and (2k+1)-th first memory cells are the same as the search data, and executes control such that both the (2k)-th and (2k+1)-th first memory cells from the side of the source line among the plurality of first memory cells enter an ON state when the data actually stored in (2k)-th and (2k+1)-th first memory cells are different from the search data.

14. The method according to claim 11, wherein the first string includes a current control memory cell connected in series to the plurality of first memory cells between the bit line and the source line, and in the sense operation, the control circuit supplies a voltage less than a threshold voltage of the current control memory cell to the word line corresponding to the current control memory cell.

15. The method according to claim 11, wherein the memory device further includes a second string in which a plurality of second memory cells are connected in series between the bit line and the source line, the first string includes a plurality of first word lines respectively controlling the plurality of first memory cells, the second string includes a plurality of second word lines respectively controlling the plurality of second memory cells, and the control circuit, in the sense operation, individually controls the first and second word lines, supplies voltages to the plurality of second word lines respectively corresponding to the plurality of second memory cells based on the search data, and determines a similarity between the search data and the data actually stored in the plurality of first memory cells and the plurality of second memory cells based on a change in voltage of the bit line caused by current flowing between the bit line and the source line via the first and second strings.

16. The method according to claim 15, wherein the first string includes a first current control memory cell connected in series to the plurality of first memory cells between the bit line and the source line, the second string includes a second current control memory cell connected in series to the plurality of second memory cells between the bit line and the source line, and in the sense operation, the control circuit controls the first current control memory cell such that first current flows between the bit line and the source line via the first string, and controls the second current control memory cell such that second current with an amount different from the first current flows between the bit line and the source line via the second string.

17. The method according to claim 16, wherein a threshold voltage of the first current control memory cell is different from a threshold voltage of the second current control memory cell.

18. The method according to claim 15, wherein the first string includes a plurality of first current control memory cells connected in series to the plurality of first memory cells between the bit line and the source line, the second string includes a plurality of second current control memory cells connected in series to the plurality of second memory cells between the bit line and the source line, the plurality of first current control memory cells have different threshold voltages, the plurality of second current control memory cells have different threshold voltages, and in the sense operation, the control circuit selects one first current control memory cell among the plurality of first current control memory cells such that first current flows between the bit line and the source line via the first string, and selects one second current control memory cell among the plurality of second current control memory cells such that second current with an amount different from the first current flows between the bit line and the source line via the second string.

19. The method according to claim 11, wherein the first string includes a plurality of current control memory cells connected in series to the plurality of first memory cells between the bit line and the source line, and threshold voltages of the plurality of current control memory cells are different from each other.

20. The method according to claim 19, wherein, in the sense operation, the control circuit supplies one word line among the plurality of word lines corresponding to the plurality of current control memory cells with voltage less than a threshold voltage of the current control memory cell corresponding to the one word line, and supplies other word lines among the plurality of word lines corresponding to the plurality of current control memory cells with voltages by which the plurality of current control memory cells are controlled to an ON state regardless of data stored therein.

* * * * *